(12) United States Patent
Hara et al.

(10) Patent No.: US 7,678,417 B2
(45) Date of Patent: Mar. 16, 2010

(54) COATING METHOD AND COATING APPARATUS

(75) Inventors: Yoshitaka Hara, Kumamoto (JP); Yasushi Hayashida, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 992 days.

(21) Appl. No.: 11/413,161

(22) Filed: Apr. 28, 2006

(65) Prior Publication Data

US 2006/0251817 A1 Nov. 9, 2006

(30) Foreign Application Priority Data

May 6, 2005 (JP) ............... 2005-135230

(51) Int. Cl.
*B05D 3/12* (2006.01)
*B65G 49/00* (2006.01)

(52) U.S. Cl. .............. 427/240; 118/52; 438/758; 414/222.09; 414/935; 414/940

(58) Field of Classification Search ........... 427/240; 118/52; 438/758; 414/222.09, 935, 940
See application file for complete search history.

(56) References Cited

U.S. PATENT DOCUMENTS

| 5,364,222 | A | | 11/1994 | Akimoto et al. |
| 5,564,889 | A | | 10/1996 | Araki |
| 5,935,768 | A | * | 8/1999 | Biche et al. ............ 430/401 |
| 5,974,682 | A | | 11/1999 | Akimoto |
| 6,245,156 | B1 | | 6/2001 | Taniyama et al. |

FOREIGN PATENT DOCUMENTS

JP 2002-50668 2/2002

* cited by examiner

*Primary Examiner*—Kirsten C Jolley
(74) *Attorney, Agent, or Firm*—Smith, Gambrell & Russell, LLP

(57) ABSTRACT

A coating apparatus has a stage module, a temperature regulating module which adjusts a temperature of a substrate to a set temperature, a coating module which applies a coating liquid to the temperature-regulated substrate, and a heating module which heats the coating-liquid applied substrate, arranged in a process section in order from an upstream end of transfer along a transfer path of the substrate, and has a dummy stage placed between the coating module and the heating module so that when by means of a substrate transfer mechanism which has an upper arm and a lower arm, provided one on the other and advanceable and retreatable independently of each other, substrates are transferred one by one from an upstream module to a downstream module in order by alternately operating the upper arm and the lower arm, that arm which performs transfer from the temperature regulating module to the coating module differ from that arm which receives a substrate from the heating module, that numbers are sequentially assigned to downstream modules with the stage module at the upstream end taken as a first module, that substrate which is located on the first stage module is received with the upper arm when the temperature regulating module is an even-numbered module, and the substrate located on the first stage module is received with the lower arm when the temperature regulating module is an odd-numbered module.

14 Claims, 15 Drawing Sheets

| PHASE | TRS4 | CPL41 | COT | DUM4 | HP4 | CPL42 | TRS9 |
|---|---|---|---|---|---|---|---|
| 1 | A01 | | | | | | |
| 2 | A02 | A01 | | | | | |
| 3 | A03 | A02 | A01 | | | | |
| 4 | A04 | A03 | A02 | A01 | | | |
| 5 | A05 | A04 | A03 | A02 | A01 | | |
| 6 | A06 | A05 | A04 | A03 | A02 | A01 | |
| 7 | A07 | A06 | A05 | A04 | A03 | A02 | A01 |
| 8 | A08 | A07 | A06 | A05 | A04 | A03 | A02 |
| 9 | A09 | A08 | A07 | A06 | A05 | A04 | A03 |
| 10 | A10 | A09 | A08 | A07 | A06 | A05 | A04 |

FIG.12

| PHASE | TRS4 | ADH | CPL4 | COT | DUM4 | HP4 | CPL42 | TRS9 |
|---|---|---|---|---|---|---|---|---|
|  |  |  |  |  |  |  |  |  |
| 1 | A01 |  |  |  |  |  |  |  |
| 2 | A02 | A01 |  |  |  |  |  |  |
| 3 | A03 | A02 | A01 |  |  |  |  |  |
| 4 | A04 | A03 | A02 | A01 |  |  |  |  |
| 5 | A05 | A04 | A03 | A02 | A01 |  |  |  |
| 6 | A06 | A05 | A04 | A03 | A02 | A01 |  |  |
| 7 | A07 | A06 | A05 | A04 | A03 | A02 | A01 |  |
| 8 | A08 | A07 | A06 | A05 | A04 | A03 | A02 | A01 |
| 9 | A09 | A08 | A07 | A06 | A05 | A04 | A03 | A02 |
| 10 | A10 | A09 | A08 | A07 | A06 | A05 | A04 | A03 |

US 7,678,417 B2

COATING METHOD AND COATING APPARATUS

BACKGROUND OF THE INVENTION

1. Field of the Invention

The present invention relates to a coating apparatus, and a coating method, which perform a coating process of applying a resist liquid or the like to a substrate, such as a semiconductor wafer or an LCD substrate (glass substrate for liquid crystal display), and a coating process for a developing liquid after exposure, and the like, and, more particularly, to a technique for substrate transfer by means of substrate transfer means.

2. Description of the Related Art

One of fabrication processes for a semiconductor device or an LCD substrate is a sequence of processes of acquiring a desired pattern by forming a resist film on a substrate, exposing the resist film using a photomask, then performing a developing process. Such a sequence of processes is generally carried out by using a resist pattern forming apparatus that has an exposure apparatus connected to a coating and developing apparatus which applies and dries a resist liquid. One example of such an apparatus is disclosed in Unexamined Japanese Patent Application KOKAI Publication No. 2002-050668. In the apparatus, as shown in, for example, FIG. 1, a carrier 10 retaining multiple wafers W is carried onto a carrier stage 11 of a carrier block 1A, and the semiconductor wafers W (hereinafter called "wafers W") in the carrier 10 are transferred to a process block 1B by a transfer arm 12. A sequence of processes for forming a resist film is executed by a coating unit 13A, etc. in the process block 1B, and then the wafers are transferred to an exposure apparatus 1D via an interface block 1C.

The wafers after exposure are returned to the process block 1B again to undergo a developing process in the developing unit 13B, after which the wafers are returned to the original carrier 10. Referring to FIG. 1, reference numerals 14A to 14C denote shelf units comprising heating units (HP, PEB, POST), cooling units (CPL1 to CPL4), a transfer stage (TRS) and so forth for performing a predetermined heating process and cooling process on wafers before and after the processing of the coating unit 13A and the processing of the developing unit 13B.

In the apparatus, the wafers W are transferred between modules, in the process block 1B, where the wafers W are to be placed, such as individual sections like the coating unit 13A, the developing unit 13B and the shelf units 14A to 14C, by a main arm 15 provided in the process block 1B. At the time wafers W are subjected to the processes, all the wafers W to be processed are transferred according to a transfer schedule that specifies at which timing each wafer is to be transferred to which module, as indicated by the technology disclosed in the aforementioned Unexamined Japanese Patent Application KOKAI Publication No. 2002-050668. In FIG. 1, reference numeral 16 is an interface arm which transfers a wafer W between the process block 1B and an exposure apparatus 1D.

FIG. 2 is an explanatory diagram illustrating a transfer path of wafers W in this system. The transfer mechanism 12 serves to transfer an unprocessed wafer W in a carrier 10, placed on the carrier stage 11, to a transfer unit (TRS), and transfer a processed wafer W, undergone development and placed on a cooling unit (CPL4), to the carrier 10. The main transfer mechanism 15 serves to transfer wafers W on the transfer unit (TRS1) to a cooling unit (CPL1), a coating unit (COT), a heating unit (HP), and a cooling unit (CPL2) in that order, and further transfer wafers W, carried out of the interface block 1C and placed into the heating unit (PEB), to a cooling unit (CPL3), a developing unit (DEV), a heating unit (POST), and a cooling unit (CPL4) in that order.

The main transfer mechanism 15, as shown in FIG. 3, for example, has three arms 15a, 15b, and 15c provided in an advanceable and retreatable manner along, for example, a base 17, and the base 17 is so configured as to be liftable up and down rotatable about the vertical axis by a lifting mechanism and a rotating mechanism, which are not shown. The configuration is such that after a wafer W placed in a preceding unit is received by, for example, one arm 15b, a wafer W placed in a next unit is received by the other arm 15c, and the wafer W placed on the one arm 15b is transferred.

At this time, between the main transfer mechanism 15 and a cooling unit (CPL1-CPL4), and a heating unit (HP, PEB, POST), the arm 15b, 15c enters a unit and transfers a wafer W therebetween, so that at the time of receiving a wafer W from a heating unit, the arm itself is heated, and the temperature rises.

When a wafer W is received from the cooling unit (CPL1) in the preceding step of the coating unit (COT) and is transferred to the coating unit (COT) using the heat-accumulated arm, heat is transferred to the wafer W cooled by the cooling unit (CPL1), raising the temperature of the wafer W during transfer, thus deteriorating the in-plane uniformity of the wafer temperature. The wafer temperature at the time of coating significantly influence the film thickness, so that when the wafer temperature changes during transfer, the in-plane uniformity of the film thickness depends on the temperature change and becomes lower.

Conventionally, therefore, one arm 15a in the main transfer mechanism 15 is provided as an exclusive arm for transfer of a wafer W to the coating unit (COT) from the cooling unit (CPL1), and a wafer W is transferred to the coating unit (COT) from the cooling unit (CPL1) using other arms whose temperatures do not change, there by suppressing a change in temperature during transfer of a wafer W cooled by the cooling unit (CPL1) and improving the in-plane uniformity of the film thickness. However, the arm 15a is not used in ordinary transfer and is not frequently used, and such an arm 15a with a low frequency of usage requires a drive system. This lowers the cost performance and stands in the way of reducing the cost of the apparatus. The use of three arms this way lead to enlargement of the main transfer mechanism.

BRIEF SUMMARY OF THE INVENTION

It is an object of the present invention to provide a coating method and a coating apparatus, which can suppress a change in the temperature of a substrate during transfer from a temperature regulating module to a coating module using substrate transfer means which has only two arms, namely an upper arm and a lower arm.

It is another object of the present invention to provide a computer program and a computer readable storage medium, which can execute such a coating method.

According to the first aspect of the invention, there is provided a coating method which uses a coating apparatus comprising a coating section having a stage module, a temperature regulating module which adjusts a temperature of a substrate to a set temperature, a coating module which applies a coating liquid to the temperature-regulated substrate, and a heating module which heats the coating-liquid applied substrate, arranged in order from an upstream end of transfer along a transfer path of the substrate; and a substrate transfer mechanism which has an upper arm and a lower arm, provided one on the other and advanceable and retreatable independently of each other, and operates to transfer the substrate downstream from an upstream side along the transfer path of the substrate, the coating method comprising:

receiving a substrate on the stage module with one of the upper arm and the lower arm;

receiving a substrate placed on a next module with the other one of the upper arm and the lower arm;

further transferring the substrate on the one of the arms to said next module; and alternately operating the upper arm and the lower arm in this manner to transfer substrates from an upstream module to a downstream module one by one, wherein a dummy stage is placed between the coating module and the heating module so as to make that arm which performs transfer from the temperature regulating module to the coating module differ from that arm which receives a substrate from the heating module, and numbers are sequentially assigned to downstream modules with the stage module at the upstream end taken as a first module, that substrate which is located on the first stage module is received with the upper arm when the temperature regulating module is an even-numbered module, and the substrate located on the first stage module is received with the lower arm when the temperature regulating module is an odd-numbered module, so that substrate transfer from the temperature regulating module to the coating module is always carried out with the lower arm.

In the coating method according to the first aspect, a dehydrphobic process module which performs a dehydrphobic process on a surface of the substrate while heating the substrate prior to application of the coating liquid to the substrate may be laid out along the transfer path, and a process may be carried out switching a transfer path where the dehydrphobic process module is used and a transfer path where the dehydrphobic process module is not used from one to the other according to the substrate. The stage module located at the upstream end of the transfer path can be a transfer module for receiving and transferring substrates. In this case, the transfer module may also serve as a cooling plate. Further, the coating module may serve to apply a resist liquid or a chemical solution for an antireflection film to a substrate. Furthermore, the coating module may serve to apply a developing liquid to a substrate, and the stage module located at the upstream end of the transfer path may be where a substrate exposed and heated is to be placed. Moreover, the coating module may serve to apply a developing liquid to a substrate, the stage module located at the upstream end of the transfer path may be where a substrate exposed is to be placed, and a module for heating and cooling a substrate may be laid out between the stage module and the temperature regulating module in the transfer path. Moreover, recognizing a substrate transfer path;

sequentially assigning numbers to downstream modules with the stage module at the upstream end taken as a first module, and recognizing whether the temperature regulating module is an even-numbered module or an odd-numbered module may further be included.

According to the second aspect of the invention, there is provided a coating method which uses a coating apparatus comprising a coating section having a stage module, a first temperature regulating module which adjusts a temperature of a substrate to a set temperature, a first coating module which applies a first coating liquid to the temperature-regulated substrate, a first heating module which heats the substrate applied with the first coating liquid, a second temperature regulating module which cools down the substrate to adjusts a temperature thereof to the set temperature, a second coating module which applies a second coating liquid to the temperature-regulated substrate, and a second heating module which heats the substrate applied with the second coating liquid, arranged in order from an upstream end of transfer along a transfer path of the substrate; and a substrate transfer mechanism which has an upper arm and a lower arm, provided one on the other and advanceable and retreatable independently of each other, and operates to transfer the substrate downstream from an upstream side along the transfer path of the substrate, the coating method comprising:

receiving a substrate on the stage module with one of the upper arm and the lower arm:

receiving a substrate placed on a next module with the other one of the upper arm and the lower arm:

further transferring the substrate on the one of the arms to said next module: and alternately operating the upper arm and the lower arm in this manner to transfer substrates from an upstream module to a downstream module one by one, wherein a first dummy stage is placed between the first coating module and the first heating module so as to make that arm which performs transfer from the first temperature regulating module to the first coating module differ from that arm which receives a substrate from the first heating module, a second dummy stage is placed between the second coating module and the second heating module so as to make that arm which performs transfer from the second temperature regulating module to the second coating module differ from that arm which receives a substrate from the second heating module, and numbers are sequentially assigned to downstream modules with the stage module at the upstream end taken as a first module, that substrate which is located on the first stage module is received with the upper arm when the first temperature regulating module and the second temperature regulating module are even-numbered modules, and the substrate located on the first stage module is received with the lower arm when the first temperature regulating module and the second temperature regulating module are odd-numbered modules, so that substrate transfer from the temperature regulating module to the coating module is always carried out with the lower arm.

In the coating method according to the first aspect, the first coating module may serve to apply a chemical liquid for an antireflection film to a substrate, and the second coating module may serve to apply a resist liquid to a substrate. A dehydrphobic process module which performs a dehydrphobic process on a top surface of the substrate while heating the substrate prior to the substrate may be laid upstream of the first temperature regulating module in the transfer path, and a process may be carried out switching a transfer path where the first temperature regulating module, the first coating module, the first dummy stage and the first heating module are used and a transfer path where the dehydrphobic process module is used in place of those modules from one to the other according to the substrate. Further, the stage module located at the upstream end of the transfer path can be a transfer module for receiving and transferring substrates. In this case, the transfer module may also serve as a cooling plate. Furthermore, recognizing a substrate transfer path;

sequentially assigning numbers to downstream modules with the stage module at the upstream end taken as a first module;

recognizing whether the temperature regulating modules are even-numbered modules or odd-numbered modules may further be included.

According to the third aspect of the invention, there is provided a coating apparatus comprising:

a coating section having a stage module, a temperature regulating module which adjusts a temperature of a substrate to a set temperature, a coating module which applies a coating liquid to the temperature-regulated substrate, and a heating module which heats the coating-liquid applied substrate, arranged in order from an upstream end of transfer along a transfer path of the substrate;

a substrate transfer mechanism which has an upper arm and a lower arm, provided one on the other and advanceable and retreatable independently of each other, and operates to transfer the substrate downstream from an upstream side along the transfer path of the substrate; and a control section which controls the substrate transfer mechanism in such a way as to receive a substrate on the stage module with one of the upper arm and the lower arm, receive a substrate placed on a next module with the other one of the upper arm and the lower arm, further transfer the substrate on the one of the arms to said next module, and alternately operate the upper arm and the lower arm in this manner to transfer substrates from an upstream module to a downstream module one by one, wherein the coating section includes a dummy stage placed between the coating module and the heating module so as to make that arm which performs transfer from the temperature regulating module to the coating module differ from that arm which receives a substrate from the heating module, and the control section controls the substrate transfer mechanism in such a way that numbers are sequentially assigned to downstream modules with the stage module at the upstream end taken as a first module, that substrate which is located on the first stage module is received with the upper arm when the temperature regulating module is an even-numbered module, and the substrate located on the first stage module is received with the lower arm when the temperature regulating module is an odd-numbered module.

In the coating apparatus according to the third aspect, the coating section may include a dehydrphobic process module, laid out along the transfer path, which performs a dehydrphobic process on a surface of the substrate while heating the substrate prior to application of the coating liquid to the substrate, and the control section may control the substrate transfer mechanism in such a way that a transfer path where the dehydrphobic process is used and a transfer path where the dehydrphobic process module is not used are switched from one to the other according to the substrate. The stage module located at the upstream end of the transfer path can be a transfer module for receiving and transferring substrates. In this case, the transfer module may also serve as a cooling plate. Further, the coating module may serve to apply a resist liquid or a chemical solution for an antireflection film to a substrate. Furthermore, the coating module may serve to apply a developing liquid to a substrate, and the stage module located at the upstream end of the transfer path may be where a substrate exposed and heated is to be placed. Moreover, the coating module may serve to apply a developing liquid to a substrate, the stage module located at the upstream end of the transfer path may be where a substrate exposed is to be placed, and a module for heating and cooling a substrate may be laid out between the stage module and the temperature regulating module in the transfer path.

According to the fourth aspect of the invention, there is provided a coating apparatus comprising:

a coating section having a stage module, a first temperature regulating module which adjusts a temperature of a substrate to a set temperature, a first coating module which applies a first coating liquid to the temperature-regulated substrate, a first heating module which heats the substrate applied with the first coating liquid, a second temperature regulating module which cools down the substrate to adjusts a temperature thereof to the set temperature, a second coating module which applies a second coating liquid to the temperature-regulated substrate, and a second heating module which heats the substrate applied with the second coating liquid, arranged in order from an upstream end of transfer along a transfer path of the substrate;

a substrate transfer mechanism which has an upper arm and a lower arm, provided one on the other and advanceable and retreatable independently of each other, and operates to transfer the substrate downstream from an upstream side along the transfer path of the substrate; and a control section which controls the substrate transfer mechanism in such a way as to receive a substrate on the stage module with one of the upper arm and the lower arm, receive a substrate placed on a next module with the other one of the upper arm and the lower arm, further transfer the substrate on the one of the arms to said next module, and alternately operating the upper arm and the lower arm in this manner to transfer substrates from an upstream module to a downstream module one by one, wherein the coating section includes a first dummy stage is placed between the first coating module and the first heating module so as to make that arm which performs transfer from the first temperature regulating module to the first coating module differ from that arm which receives a substrate from the first heating module, and a second dummy stage is placed between the second coating module and the second heating module so as to make that arm which performs transfer from the second temperature regulating module to the second coating module differ from that arm which receives a substrate from the second heating module, and the control section controls the substrate transfer mechanism in such a way that numbers are sequentially assigned to downstream modules with the stage module at the upstream end taken as a first module, that substrate which is located on the first stage module is received with the upper arm when the first temperature regulating module and the second temperature regulating module are even-numbered modules, and the substrate located on the first stage module is received with the lower arm when the first temperature regulating module and the second temperature regulating module are odd-numbered modules.

In the coating apparatus according to the fourth aspect, the first coating module may serve to apply a chemical liquid for an antireflection film to a substrate, and the second coating module may serve to apply a resist liquid to a substrate. The coating section may include a dehydrphobic process module, laid out upstream of the first temperature regulating module in the transfer path, which performs a dehydrphobic process on a top surface of the substrate while heating the substrate prior to application of the coating liquid to the substrate, and the control section may control the substrate transfer mechanism in such a way that a transfer path where the first temperature regulating module, the first coating module, the first dummy stage and the first heating module are used and a transfer path where the dehydrphobic process module is used in place of those modules are switched from one to the other according to the substrate. Further, the stage module located at the upstream end of the transfer path can be a transfer module for receiving and transferring substrates. In this case, the transfer module also serves as a cooling plate.

According to the fifth aspect of the invention, there is provided A computer program which causes a computer to control a coating apparatus comprising:

a coating section having a stage module, a temperature regulating module which adjusts a temperature of a substrate to a set temperature, a coating module which applies a coating liquid to the temperature-regulated substrate, a heating module which heats the coating-liquid applied substrate, arranged in order from an upstream end of transfer along a transfer path of the substrate, and a dummy stage placed between the coating module and the heating module so as to make that arm which performs transfer from the temperature regulating module to the coating module differ from that arm which receives a substrate from the heating module; and a substrate transfer mechanism which has an upper arm and a lower arm, provided one on the other and advanceable and retreatable independently of each other, and operates to transfer the substrate downstream from an upstream side along the transfer path of the substrate, the program, when executed, causing the computer to control the coating apparatus in such a way as to receive a substrate on the stage module with one of the upper arm and the lower arm, receive a substrate placed on a next module with the other one of the upper arm and the lower arm, further transfer the substrate on the one of the arms to said next module, and alternately operate the upper arm and the lower arm in this manner to transfer substrates from an upstream module to a downstream module one by one, and to sequentially assign numbers to downstream modules with the stage module at the upstream end taken as a first module, receive that substrate which is located on the first stage module with the upper arm when the temperature regulating module is an even-numbered module, and receive the substrate located on the first stage module with the lower arm when the temperature regulating module is an odd-numbered module, so that substrate transfer from the temperature regulating module to the coating module is always carried out with the lower arm.

According to the sixth aspect of the invention, there is provided a computer readable storage medium having stored a control program which causes a computer to control a coating apparatus comprising:

a coating section having a stage module, a temperature regulating module which adjusts a temperature of a substrate to a set temperature, a coating module which applies a coating liquid to the temperature-regulated substrate, a heating module which heats the coating-liquid applied substrate, arranged in order from an upstream end of transfer along a transfer path of the substrate, and a dummy stage placed between the coating module and the heating module so as to make that arm which performs transfer from the temperature regulating module to the coating module differ from that arm which receives a substrate from the heating module; and a substrate transfer mechanism which has an upper arm and a lower arm, provided one on the other and advanceable and retreatable independently of each other, and operates to transfer the substrate downstream from an upstream side along the transfer path of the substrate, the program, when executed, causing the computer to control the coating apparatus in such a way as to receive a substrate on the stage module with one of the upper arm and the lower arm, receive a substrate placed on a next module with the other one of the upper arm and the lower arm, further transfer the substrate on the one of the arms to said next module, and alternately operate the upper arm and the lower arm in this manner to transfer substrates from an upstream module to a downstream module one by one, and to sequentially assign numbers to downstream modules with the stage module at the upstream end taken as a first module, receive that substrate which is located on the first stage module with the upper arm when the temperature regulating module is an even-numbered module, and receive the substrate located on the first stage module with the lower arm when the temperature regulating module is an odd-numbered module, so that substrate transfer from the temperature regulating module to the coating module is always carried out with the lower arm.

According to the seventh aspect of the invention, there is provided a computer program which causes a computer to control a coating apparatus comprising a coating section having a stage module, a first temperature regulating module which adjusts a temperature of a substrate to a set temperature, a first coating module which applies a first coating liquid to the temperature-regulated substrate, a first heating module which heats the substrate applied with the first coating liquid, a second temperature regulating module which cools down the substrate to adjusts a temperature thereof to the set temperature, a second coating module which applies a second coating liquid to the temperature-regulated substrate, a second heating module which heats the substrate applied with the second coating liquid, arranged in order from an upstream end of transfer along a transfer path of the substrate, a first dummy stage is placed between the first coating module and the first heating module so as to make that arm which performs transfer from the first temperature regulating module to the first coating module differ from that arm which receives a substrate from the first heating module, and a second dummy stage is placed between the second coating module and the second heating module so as to make that arm which performs transfer from the second temperature regulating module to the second coating module differ from that arm which receives a substrate from the second heating module; and a substrate transfer mechanism which has an upper arm and a lower arm, provided one on the other and advanceable and retreatable independently of each other, and operates to transfer the substrate downstream from an upstream side along the transfer path of the substrate, the program, when executed, causing to control the coating apparatus in such a way as to receive a substrate on the stage module with one of the upper arm and the lower arm, receive a substrate placed on a next module with the other one of the upper arm and the lower arm, further transfer the substrate on the one of the arms to said next module, and alternately operate the upper arm and the lower arm in this manner to transfer substrates from an upstream module to a downstream module one by one, and to sequentially assign numbers to downstream modules with the stage module at the upstream end taken as a first module, receive that substrate which is located on the first stage module with the upper arm when the first temperature regulating module and the second temperature regulating module are even-numbered modules, and receive the substrate located on the first stage module with the lower arm when the first temperature regulating module and the second temperature/regulating module are odd-numbered modules, so that substrate transfer from the temperature regulating module to the coating module is always carried out with the lower arm.

According to the eighth aspect of the invention, there is provided a computer readable storage medium having stored computer program which causes a computer to control a coating apparatus comprising:

a coating section having a stage module, a first temperature regulating module which adjusts a temperature of a substrate to a set temperature, a first coating module which applies a first coating liquid to the temperature-regulated substrate, a first heating module which heats the substrate applied with the first coating liquid, a second temperature regulating module which cools down the substrate to adjusts a temperature thereof to the set temperature, a second coating module which applies a second coating liquid to the temperature-regulated substrate, a second heating module which heats the substrate applied with the second coating liquid, arranged in order from an upstream end of transfer along a transfer path of the substrate, a first dummy stage is placed between the first coating module and the first heating module so as to make that arm which performs transfer from the first temperature regulating module to the first coating module differ from that arm which receives a substrate from the first heating module, and a second dummy stage is placed between the second coating module and the second heating module so as to make that arm which performs transfer from the second temperature regulating module to the second coating module differ from that arm which receives a substrate from the second heating module; and a substrate transfer mechanism which has an upper arm and a lower arm, provided one on the other and advanceable and retreatable independently of each other, and operates to transfer the substrate downstream from an upstream side along the transfer path of the substrate, the program, when executed, causing the computer to control the coating apparatus in such a way as to receive a substrate on the stage module with one of the upper arm and the lower arm, receive a substrate placed on a next module with the other one of the upper arm and the lower arm, further transfer the substrate on the one of the arms to said next module, and alternately operate the upper arm and the lower arm in this manner to transfer substrates from an upstream module to a downstream module one by one, and to sequentially assign numbers to downstream modules with the stage module at the upstream end taken as a first module, receive that substrate which is located on the first stage module with the upper arm when the first temperature regulating module and the second temperature regulating module are even-numbered modules, and receive the substrate located on the first stage module with the lower arm when the first temperature regulating module and the second temperature/regulating module are odd-numbered modules, so that substrate transfer from the temperature regulating module to the coating module is always carried out with the lower arm.

According to the invention, as transfer of a substrate to the coating module from the temperature regulating module is always carried out with the lower arm, and reception of a substrate from the heating module to which the substrate has been transferred from the coating module is always carried out with the upper arm, no substrate is transferred to the coating module from the temperature regulating module using the upper arm that has been heated when receiving the substrate from the heating module. Accordingly, the substrate whose temperature has been regulated with high precision in the temperature regulating module is transferred to the coating module from the temperature regulating module with the lower arm whose temperature does not change much, so that the substrate can be transferred with thermal influence of the arms suppressed, thus ensuring suppression of a change in the uniformity of the in-plane temperature of the substrate. This makes it possible to perform application of the coating liquid with high uniformity of the in-plane temperature of the substrate and the adequate substrate temperature, so that an adequate application with high in-plane uniformity can be carried out.

As reception of a substrate from the heating module is done with the upper arm, and the heat of the upper arm is likely to propagate upward, it is possible to reduce the thermal influence on the other arm as compared with the case of receiving the substrate from the heating module with the lower arm.

According to the present invention, the temperature regulating module is not limited to the one provided with a temperature regulating mechanism, but it may include a simple plate for adjustment to, for example, room temperature. Recognizing the transfer path of a substrate is carried out with a module, such as the stage module or the coating module where the substrate is to be transferred, and the dummy stage, and by selecting a transfer recipe which designates the transfer order for substrates to those modules and the dummy stage.

BRIEF DESCRIPTION OF THE SEVERAL VIEWS OF THE DRAWINGS

FIG. 12 is an explanatory diagram illustrating one example of a wafer transfer schedule in a unit block for formation of a coating film;

DETAILED DESCRIPTION OF THE INVENTION

First, the outline of a coating method according to the invention will be described with reference to an example where the method of the present invention is adapted to application of a resist liquid.

Figure 1:
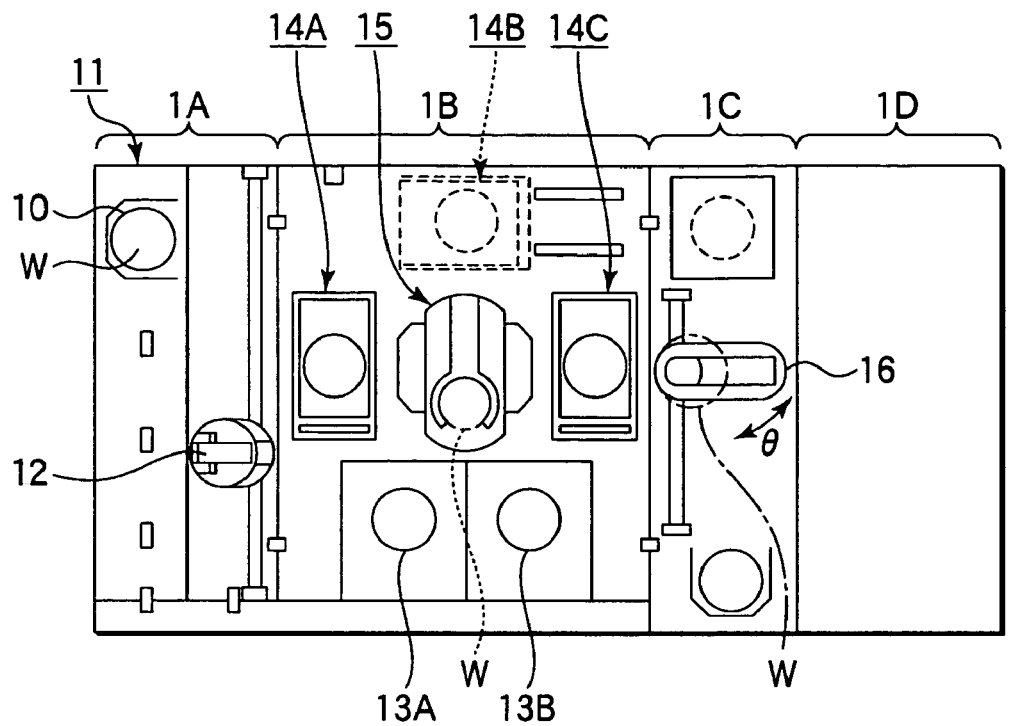
FIG. 1 is a plan view showing a conventional coating and developing apparatus.
Figure 2:
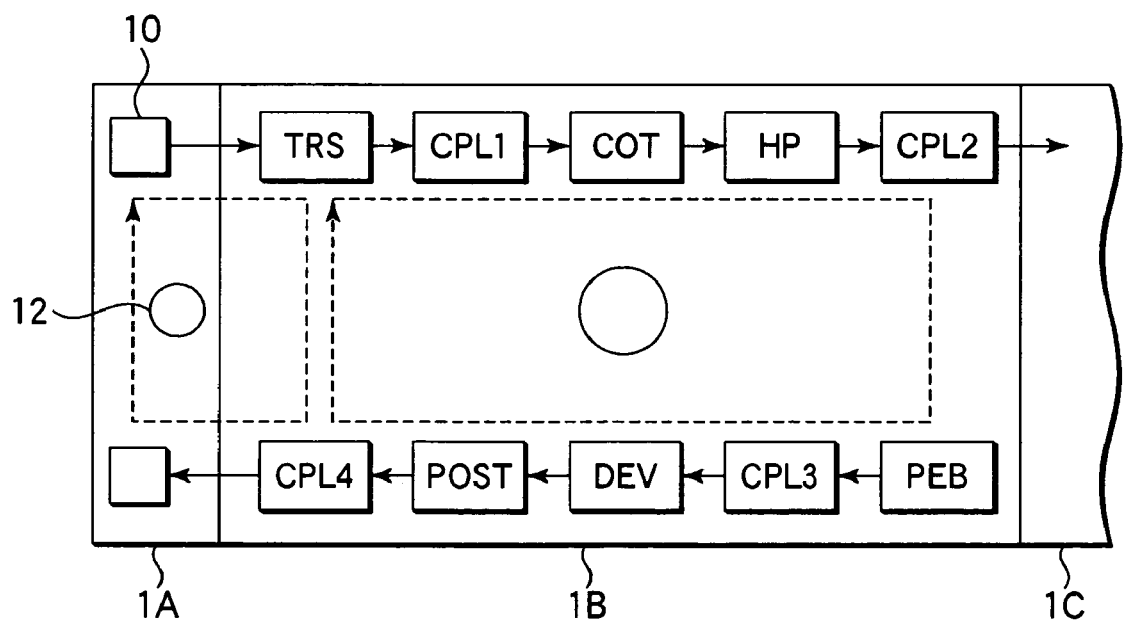
FIG. 2 is an explanatory diagram illustrating the flow of a substrate and the movement of the transfer means in the conventional coating and developing apparatus.
Figure 3:
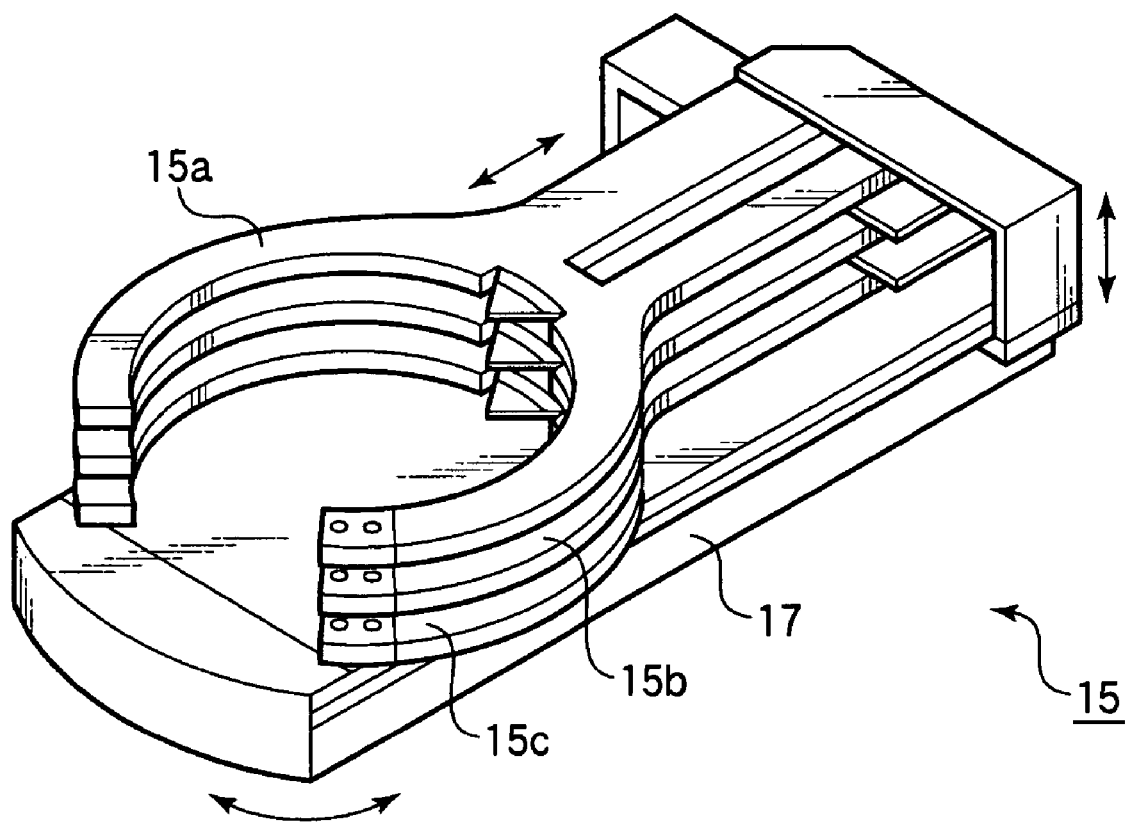
FIG. 3 is a perspective view showing one example of substrate transfer means which is used in the conventional coating and developing apparatus.
Figure 4:
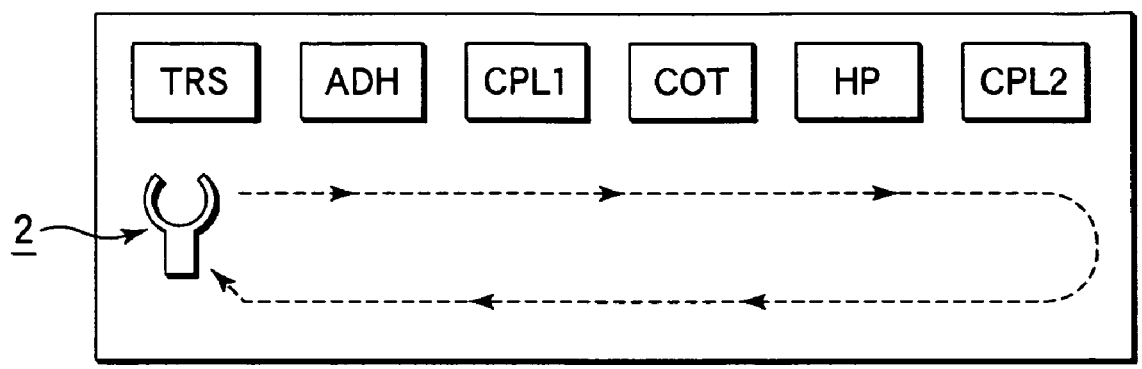
FIG. 4 is an explanatory diagram illustrating the layout of modules to be used in a coating method according to the present invention.

As shown in FIG. 4, a stage module (TRS) positioned at, for example, an upstream end in a transfer path for wafers W as substrates, a dehydrphobic process module (ADH) which heats a wafer W and performs a dehydrphobic process on the top surface of the wafer W, a temperature regulating module (CPL1) which regulates the temperature of the wafer W to a set temperature, a coating module (COT) which applies a coating liquid, e.g., a resist liquid, to the temperature-regulated substrate, a heating module (HP) which heats the substrate applied with the coating liquid, and a cooling module (CPL2) which cools down the substrate are laid out in a coating apparatus, in the order mentioned from the upstream side.

Figure 5:
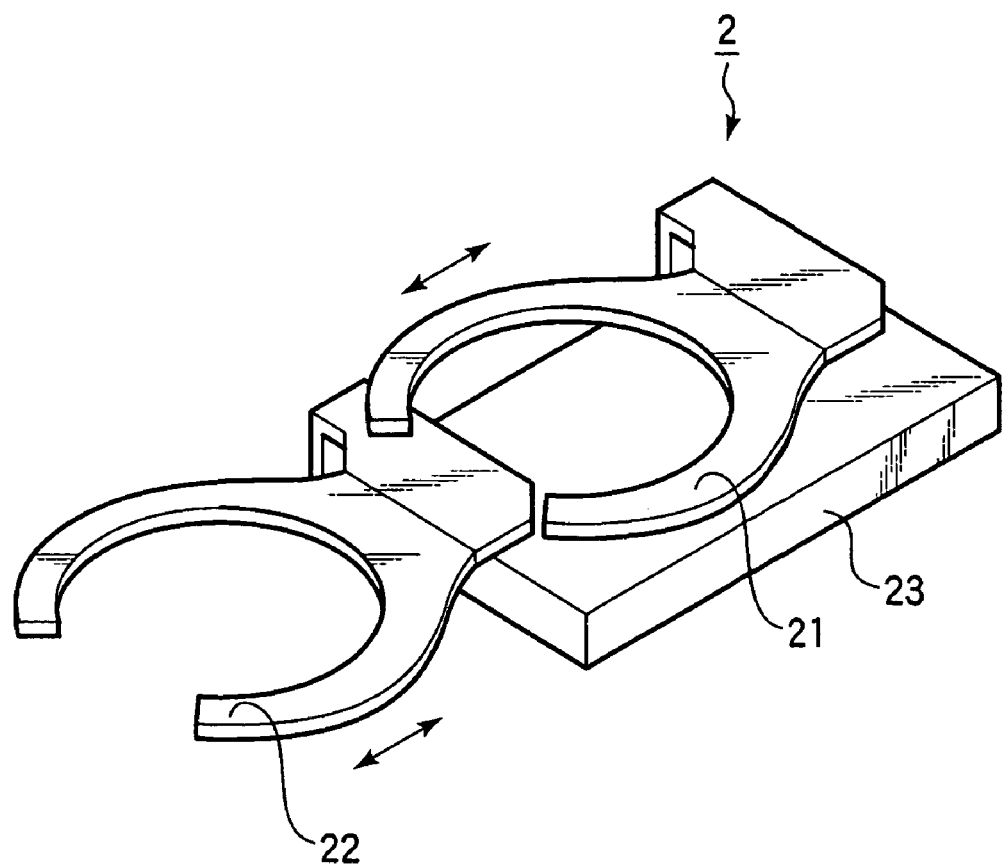
FIG. 5 is a perspective view showing substrate transfer means which is used in the coating method according to the present invention.

In the apparatus, as shown in FIG. 5, a substrate transfer mechanism 2 having two arms, namely an upper arm 21 and a lower arm 22, transfers a wafer W downstream from upstream along the transfer path. When the resist liquid is applied to a wafer W having an antireflection film formed thereon, the wafer W is transferred along a transfer path where the dehydrphobic process module (ADH) is not used, i.e., in the order of the stage module (TRS)→temperature regulating module (CPL1)→coating module (COT)→heating module (HP)→cooling module (CPL2). When the resist liquid is applied to a wafer W having no antireflection film formed thereon, the wafer W is transferred along a transfer path where the dehydrphobic process module (ADH) is used, i.e., in the order of the stage module (TRS)→dehydrphobic process module (ADH)→temperature regulating module (CPL1)→coating module (COT)→heating module (HP)→cooling module (CPL2).

The upper arm 21 and the lower arm 22 of the substrate transfer mechanism 2, which are provided one above the other are configured in such a way as to be advanceable and retreatable independently along the base 23. In the substrate transfer mechanism 2, a wafer W on the stage module (TRS) is received with one of the upper arm 21 and the lower arm 22, a wafer W placed on the next module is received with the other one of the upper arm 21 and the lower arm 22, the wafer W on the one arm is transferred to the next module, and the upper arm 21 and the lower arm 22 are alternately operated this way to transfer wafers W one by one from the upstream module to downstream modules.

Figure 6A:
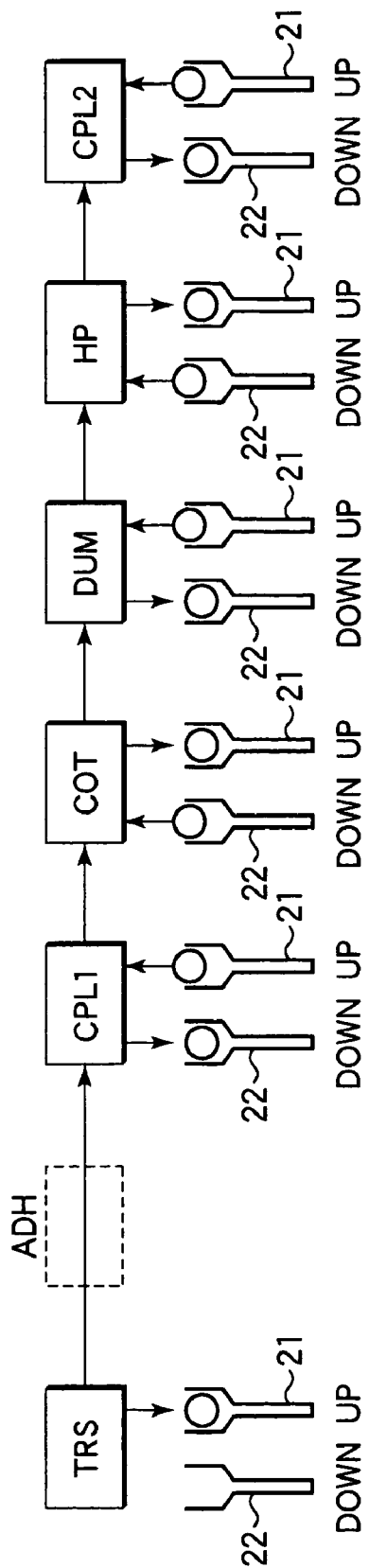
FIGS. 6A and 6B are diagrams illustrating the layout of modules and arms which are used in a substrate transfer mechanism for explaining the outline of the coating method according to the present invention.

When the temperature regulating module (CPL1) becomes an even-numbered (second) module if numbers are sequentially assigned to the downstream modules with the stage module (TRS) taken as the first module, as in a case where a wafer W is transferred in a transfer path in which the dehydrphobic process module (ADH) is not used as shown in FIG. 6A, the upper arm 21 goes to pick up the wafer W located on the first stage module (TRS), the lower arm 22 receives the wafer W placed on the following temperature regulating module (CPL1), and the wafer W on the upper arm 21 is transferred to the temperature regulating module (CPL1). Accordingly, the lower arm 22 receives the wafer W on the temperature regulating module (CPL1), the upper arm 21 receives the wafer W placed on the coating module (COT), and the wafer W on the lower arm 22 is transferred to the coating module (COT).

For an odd-numbered module when numbers are sequentially assigned to the downstream modules with the temperature regulating module (CPL1) taken as the first module, the wafer W on this module is picked up by the same arm as the one that goes to pick up the wafer W on the temperature regulating module (CPL1), so that when the wafer W is transferred to the heating module (HP) after the coating module (COT), the arm that performs transfer from the temperature regulating module (CPL) to the coating module (COT) becomes the same as the arm that receives the wafer W from the heating module (HP).

Accordingly, according to the present invention, a dummy stage (DUM) is placed between the coating module (COT) and the heating module (HP) in the transfer path to make the arm (lower arm 22) that performs transfer from the temperature regulating module (CPL1) to the coating module (COT) differ from the arm (upper arm 21) that the receives the wafer W from the heating module (HP).

Figure 6B:
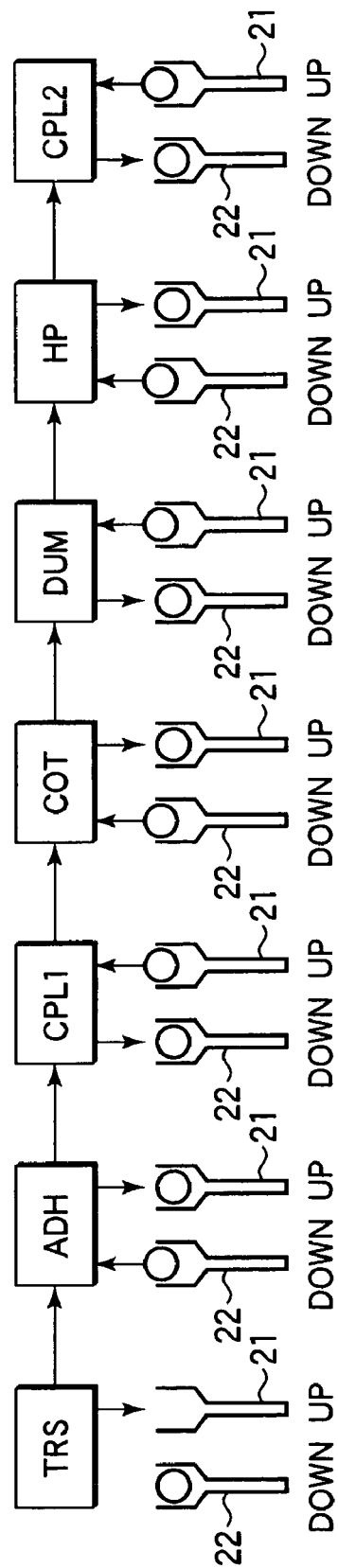

When the temperature regulating module (CPL1) becomes an odd-numbered (third) module if numbers are sequentially assigned to the downstream modules with the stage module (TRS) taken as the first module, as in a case where a wafer W is transferred in a transfer path in which the dehydrphobic process module (ADH) is used as shown in FIG. 6B, the lower arm 22 goes to pick up the wafer W located on the first stage module (TRS), the upper arm 21 receives the wafer W placed on the following dehydrphobic process module (ADH), and the wafer W on the lower arm 22 is transferred to the dehydrphobic process module (ADH). Accordingly, the lower arm 22 receives the wafer W on the temperature regulating module (CPL1), the upper arm 21 receives the wafer W placed on the coating module (COT), and the wafer W on the lower arm 22 is transferred to the coating module (COT).

Even in this case, without a dummy stage (DUM) provided between the coating module (COT) and the heating module (HP), the arm that performs transfer from the temperature regulating module (CPL1) to the coating module (COT) becomes the same as the arm that receives the wafer W from the heating module (HP). Accordingly, a dummy stage (DUM) is placed between the coating module (COT) and the heating module (HP) in the transfer path to make the arm (lower arm 22) that performs transfer from the temperature regulating module (CPL1) to the coating module (COT) differ from the arm (upper arm 21) that the receives the wafer W from the heating module (HP).

Figure 7:
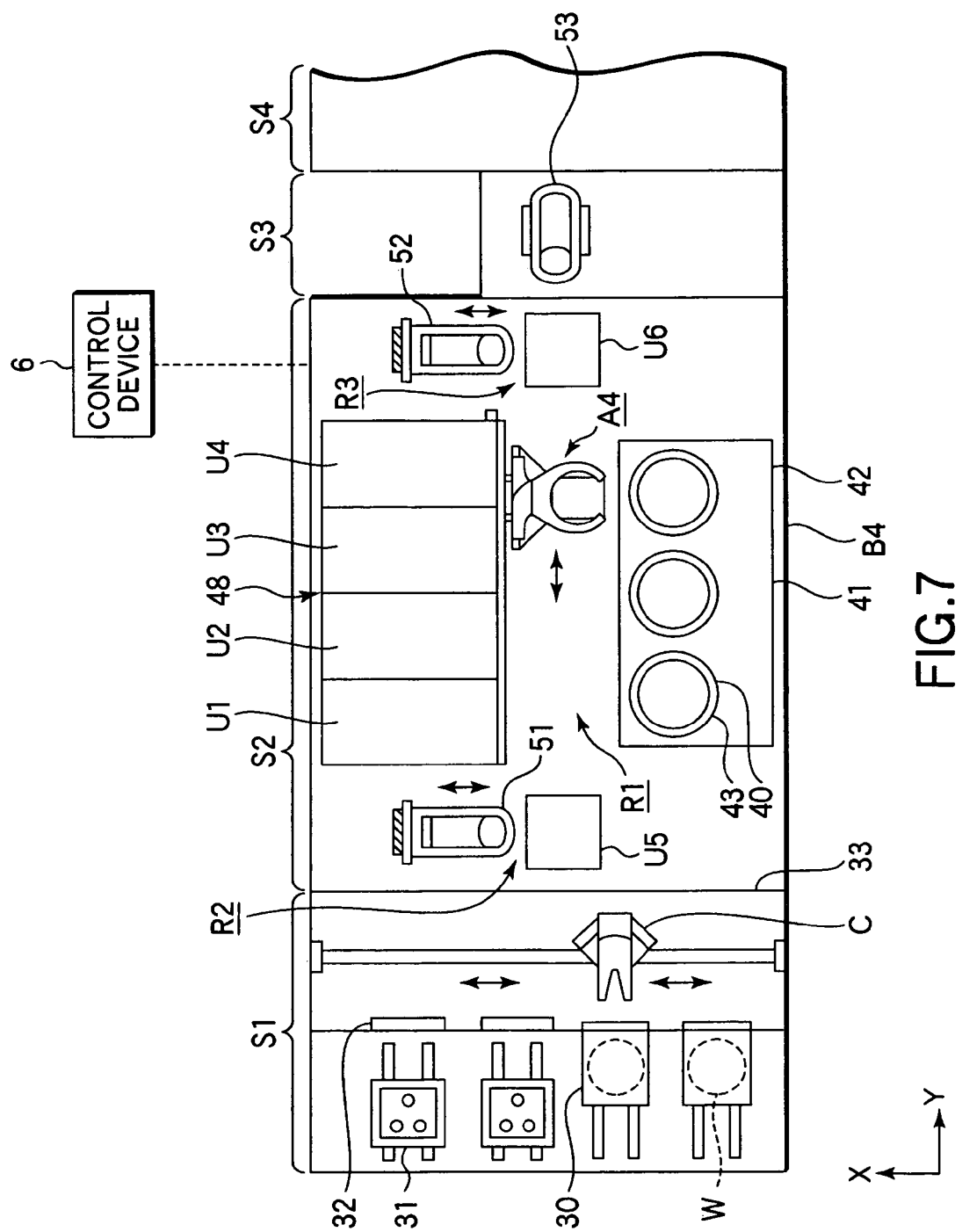
FIG. 7 is a plan view showing a coating and developing apparatus to be adapted to a first embodiment of the present invention.
Figure 8:
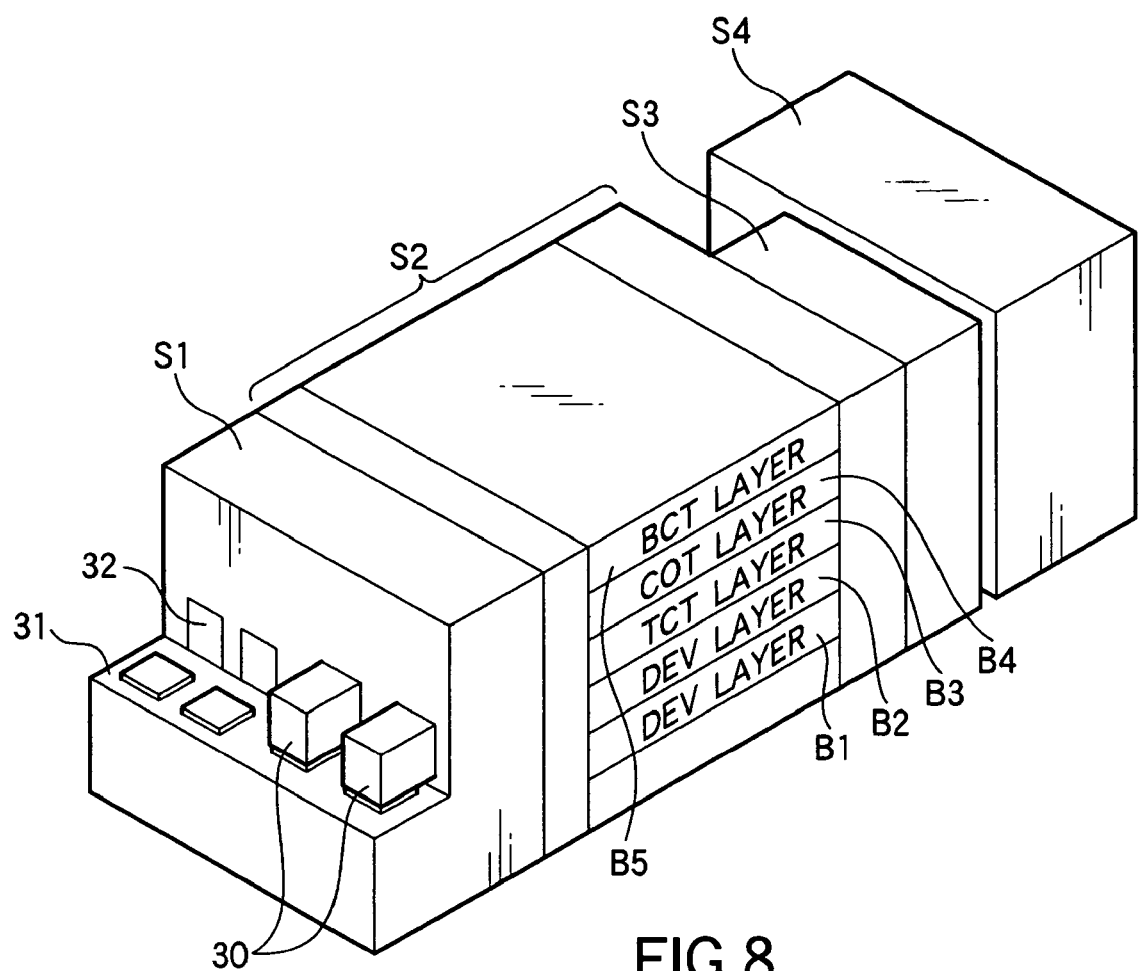
FIG. 8 is a schematic perspective view showing the general structure of the coating and developing apparatus in FIG. 7.
Figure 9:
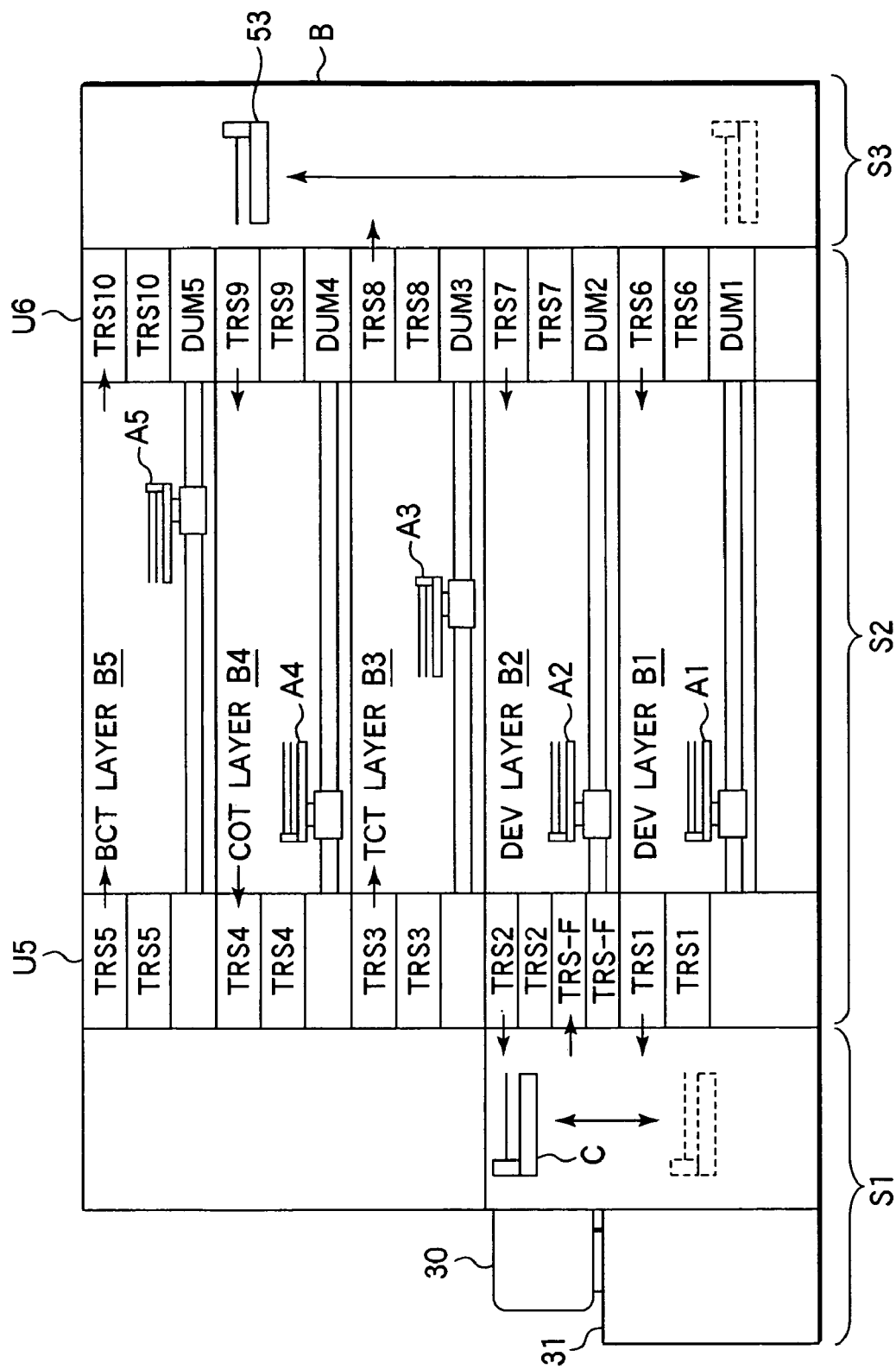
FIG. 9 is a schematic vertical cross-sectional view showing the coating and developing apparatus in FIG. 7.

A first embodiment of the invention will be described first. FIG. 7 is a plan view of a coating and developing apparatus to be adapted to the first embodiment of the invention, FIG. 8 is a schematic perspective view of the coating and developing apparatus, and FIG. 9 is a schematic vertical cross-sectional view of the coating and developing apparatus. The coating and developing apparatus comprises a carrier block S1 which carries in and out carriers 30 each retaining, for example, thirteen wafers W or substrates in an airtight manner, a process block S2 provided adjacent to the carrier block S1 and having five unit blocks B1 to B5, and an interface block S3 provided on the opposite side of the process block S2 to the carrier block S1. The resist pattern forming apparatus has an exposure apparatus S4 connected to the interface block S3. The operation of the resist pattern forming apparatus is controlled by a control section 6 comprising a computer.

The carrier block S1 includes a stage 31 where a plurality of carriers 30 can be mounted, an opening/closing section 32 provided on the front wall as seen from the stage 31, and a carrier-block transfer mechanism C which carries wafers W out of the carrier 30 via the opening/closing section 32. The carrier-block transfer mechanism C is so constructed as to be movable forward and backward, liftable, rotatable about the vertical axis, and movable in the layout direction of the carriers 30 to transfer wafers W among transfer stages TRS1, TRS2 and TRS-F of a unit block B2 to be discussed later.

The process block S2, connected to the carrier block S1, is surrounded by a casing 33. The process block S2 has a multilevel structure where lower two stages are first and second unit blocks (DEV layers) B1 and B2 which perform a developing process, and a third unit block (TCT layer) B3, which performs a process of forming an antireflection film above a resist film (the antireflection film will be hereinafter called "second antireflection film"), a fourth unit block (COT layer) B4, which performs a process of coating a resist liquid, and a fifth unit block (BCT layer) B5, which performs a process of forming an antireflection film under the resist film (the antireflection film will be hereinafter called "first antireflection film"), are formed in order above the first and second unit blocks B1 and B2. The DEV layers B1 and B2 are equivalent to unit blocks for development, and the TCT layer B3, the COT layer B4 and the BCT layer B5 are equivalent to unit blocks for coat-film formation.

The process block S2 has a shelf unit U5 on its carrier block S1 side and has a plurality of transfer stages placed one on the other and penetrating through the unit blocks B1 to B5, and has a shelf unit U6 on its interface block S3 side and has a plurality of transfer stages placed one on the other and penetrating through the unit blocks B1 to B5.

Next, the structures of the first to fifth unit blocks B1 to B5 will be discussed.

Each of those unit blocks B1 to B5 has a liquid process unit for coating a chemical solution on wafers W, and a plurality of process units of various processing systems, such as heating and cooling, which perform a pre-process and a post-process to the process that is executed by the liquid process unit. Each of the unit blocks B1 to B5 also has exclusive main transfer arms or transfer mechanisms A1 to A5 for transferring wafers W between the liquid process unit and the heating and cooling units.

As the unit blocks B1 to B5 are constructed with nearly the same layouts, the fourth unit block (COT layer) B4 shown in FIG. 7 will be discussed as a representative example.

A transfer area R1 for wafers W is formed at nearly the center of the COT layer B4 in such a way as to extend from the carrier block S1 side to the interface block S3 side in the Y direction in the diagram. As the liquid process unit, a coating module 41 having plural (three in the diagram) coating sections 40 for performing resist coating, and a casing 42, which accommodates the coating sections 40, is provided on the right-hand side of the transfer area R1 as seen from the carrier block S1 side. Each coating section 40 has a wafer holding section (not shown) which rotates a wafer while holding it, and a cup 43 which surrounds the wafer holding section. The coating section 40 supplies a resist liquid to the center portion of a wafer using a nozzle or the like, and rotates the wafer holding section to spread the resist liquid to perform a coating process.

A heating and cooling section 48 is provided on the left-hand side of the transfer area R1 as seen from the carrier block S1 side. The heating and cooling section 48 includes four shelf units U1, U2, U3 and U4 provided in order from the carrier block S1 side and having heating and cooling units multileveled. Each of the shelf units U1 to U4 of the heating and cooling section 48 has a multilevel structure of various units for performing a pre-process and a post-process to the process which is performed in the coating module 41, for example, a two-stage structure.

Figure 10:
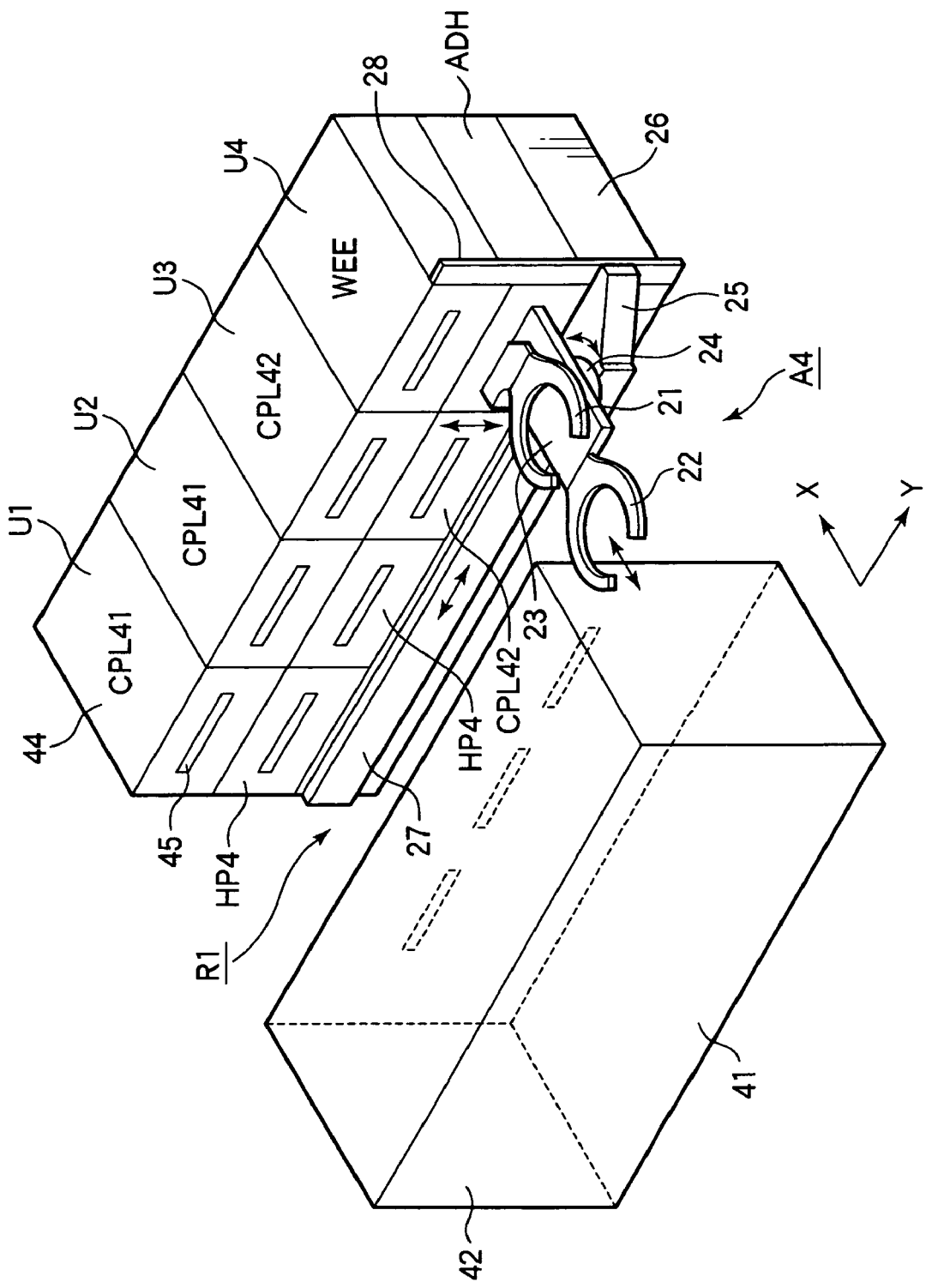
FIG. 10 is a perspective view showing a fourth unit block (COT layer) in the coating and developing apparatus in FIG. 7.

A plurality of various modules which constitute the heating and cooling section 48 and perform a pre-process and a post-process include, for example, as shown in FIG. 10, a temperature regulating module (CPL41) for adjusting the temperature of a wafer W to a set temperature before coating a resist liquid, a heating module (HP4) called, for example, a prebaking unit, for heating wafers W after application of the resist liquid, a cooling module (CPL42) for executing a process of cooling the wafer W to pre-adjust the temperature thereof to, for example, a temperature in the exposure apparatus S4 with high precision, and a dehydrphobic process module (ADH) which performs a dehydrphobic process on the top surface of a wafer W by heating the wafer W to improve the adhesion between the resist liquid and the wafer W after application of the resist liquid, and a periphery exposure apparatus (WEE) for selectively exposing only the edge portions of the wafer W. The individual process units, such as the temperature regulating module (CPL41) and the heating module (HP4), are accommodated in a process container 44. Each of the shelf units U1 to U4 is constructed by two process containers 44 stacked one on the other, and a wafer inlet/output port 45 is formed in that side of each process container 44 which faces the transfer area R1.

The main transfer mechanism A4 is provided in the transfer area R1. The main transfer mechanism A4 is constructed in such a way as to transfer wafers among all the modules in the fourth unit block (COT layer) B4, and individual transfer stages of the shelf unit U5 and the shelf unit U6. For this purpose, the main transfer mechanism A4 is so constructed as to be movable forward and backward, liftable, rotatable about the vertical axis, and movable in the Y-axial direction.

As shown in FIG. 10, for example, the main transfer mechanism A4 comprises two arms, an upper arm 21 and a lower arm 22, laid one above the other, for supporting the peripheral area of a wafer W at the back thereof. The upper arm 21 and the lower arm 22 are configured in such a way as to be independently advanceable and retreatable along a base 23. The base 23 is so configured as to be rotatable about the vertical axis by a rotating mechanism 24, and to be movable in the direction of the Y axis along a Y-axial rail 27, attached to that side of a support 26 which faces the transfer area R1, in the Y-axial direction, and to be liftable up and down along a lift rail 28. The support 26 supports the shelf units U1 to U4. The Y-axial rail 27 guides the base 23 in the Y-axial direction. This structure allows the upper arm 21 and lower arm 22 to be advanceable and retreatable, movable in the Y-axial direction, liftable, and rotatable about the vertical axis, so that wafers W can be transferred the process units of the shelf units U1 to U4, and the first and second transfer stages the dummy stage (DUM), and the coating module (COT) of the shelf units U5 and U6. The main transfer mechanisms A1, A2, A3 and A5 of the other unit blocks have quite the same structures.

That area of the transfer area R1 which is adjacent to the carrier block S1 is a first wafer transfer area R2. As shown in FIGS. 7 and 9, the shelf unit U5 is provided at that position in the area R2 where the carrier-block transfer mechanism C and the main transfer mechanism A4 can access. A first transfer mechanism 51 for transferring a wafer W to and from the shelf unit U5 can pass through the area R2. The first transfer mechanism 51 is movable up and down, penetrating the first to fifth unit blocks B1 to B5 along the shelf unit U5.

That area of the transfer area R1 which is adjacent to the interface block S3 is a second wafer transfer area R3. As shown in FIGS. 7 and 9, the shelf unit U5 is provided at that position in the area R3 where the main transfer mechanism A4 can access. A second transfer mechanism 52 for transferring a wafer W to and from the shelf unit U6 can pass through the area R3. The second transfer mechanism 52 is movable up and down, penetrating the first to fifth unit blocks B1 to B5 along the shelf unit U6.

The shelf unit U5 has first transfer stages TRS1 to TRS5, two each, at the positions corresponding to the unit blocks B1 to B5, as shown in FIG. 9, thereby providing a first transfer stage group comprises a stack of multiple first transfer stages. The first transfer stages TRS1 to TRS5 transfer wafers W to and from the main transfer mechanisms A1 to A5 of the respective unit blocks B1 to B5. The first transfer mechanism 51 is so constructed as to be movable forward and backward and liftable to be able to transfer wafers W to and from the first transfer stages TRS1 to TRS5. Although the first transfer stages TRS1 to TRS5 are provided, two each, in this embodiment, they may be provided, one each, or three or more each.

The first transfer stages TRS1 and TRS2 of the first and second unit blocks B1 and B2 are is constructed in such a way as to transfer wafers W to and from the carrier-block transfer mechanism C of the carrier block S1. The shelf unit U5 further includes two transfer stages TRS-F at portions corresponding to the second unit block B2, and the transfer stages TRS-F are used as exclusive transfer stages with which the carrier-block transfer mechanism C transfers wafers W into the process block S2. The transfer stages TRS-F may be provided in the first unit block B1. Without the transfer stages TRS-F provided separately, wafers W may be transferred into the process block S2 from the carrier-block transfer mechanism C using the first transfer stages TRS1 and TRS2.

The shelf unit U6 has second transfer stages TRS6 to TRS10, two each, at the positions corresponding to the unit blocks B1 to B5, as shown in FIGS. 5 and 9, thereby providing a second transfer stage group comprises a stack of multiple second transfer stages. The second transfer stages TRS6 to TRS10 transfer wafers W to and from the main transfer mechanisms A1 to A5 of the respective unit blocks B1 to B5. The second transfer mechanism 52 is so constructed as to be movable forward and backward and liftable to be able to transfer wafers W to and from the second transfer stages TRS6 to TRS10. Although the second transfer stages TRS6 to TRS10 are provided, two each, in this embodiment, they may be provided, one each, or three or more each.

In the embodiment, wafers W can be freely transferred among the stack of five unit blocks B1 to B5 through the respective first transfer stages TRS1 to TRS5 and TRS-F, and second transfer stages TRS6 to TRS10, by the first transfer arm 51 and the second transfer arm 52.

In the COT layer B4, for example, either the first transfer stage TRS4 or the second transfer stage TRS9 is used as a transfer module which serves as a stage module located at the upstream end in the transfer path. Further, at least one, e.g., one dummy stage (DUM1-DUM5) is provided in either the shelf unit U5 or the shelf unit U6 at a position where the main arms A1 to A5 of the unit blocks B1 to B5 can access.

The structures of the other unit blocks will now be discussed. The TCT layer B3 and the BCT layer B5 have substantially similar structures to the structure of the COT layer B4 except that the chemical liquid in the coating module is used in placed of the resist liquid to form an antireflection film, and an antireflection film module serving as a coating module for forming an antireflection film is provided. For example, the shelf unit U5 or the shelf unit U6 in the TCT layer B3 is provided with first transfer stages TRS3, TRS8, which serve as stage modules, and a dummy stage (DUM3), and each of the shelf units U1 to U4 is provided with an antireflection film module (BARC2) for forming an antireflection film on the top side of a resist film, a temperature regulating module (CPL31) for regulating the temperature of a wafer W to a set temperature prior to application of a chemical liquid for the antireflection film, a heating module (HP3) for performing a process of heating the wafer W after application of the chemical liquid, a cooling module (CPL32) for performing a process of cooling the wafer W after application of the chemical liquid, and the like. In addition to those components, a main arm A3 is provided which serves as substrate transfer means to transfer a wafer W among the modules and the dummy stage (DUM3).

For example, the shelf unit U5 or the shelf unit U6 in the BCT layer B5 is provided with first transfer stages TRS5, TRS10, which serve as stage modules, and a dummy stage (DUM5), and each of the shelf units U1 to U4 is provided with an antireflection film module (BARC1) for forming an antireflection film on the bottom side of a resist film, a temperature regulating module (CPL51) for regulating the temperature of a wafer W to a set temperature prior to application of a chemical solution for the antireflection film, a heating module (HP5) for performing a process of heating the wafer W after application of the chemical solution, a cooling module (CPL52) for performing a process of cooling the wafer W after application of the chemical solution, and the like. In addition to those components, a main arm A3 is provided which serves as a substrate transfer mechanism to transfer a wafer W among the modules and the dummy stage (DUM5).

Each of the DEV layers B1, B2, which have a similar structure and are configured in a way similar to the structure of the COT layer B4, except that a developing module (DEV) serving as a coating module for applying a developing liquid to a wafer W, and each of the shelf units U1 to U4 has heating modules (PEB1, PEB2), called a post-exposure baking unit or so, which performs a heating process on wafers W after exposure, temperature regulating modules (CPL11, CPL21) for regulating the temperature of a wafer W to a set temperature after the heating process in the heating modules (PEB1, PEB2), and heating modules (POST1, POST2), called a post-baking unit or so, which perform a heating process to dry out water on wafers W after a developing process. The developing unit holds a wafer at the wafer holding section surrounded by the cup, performs the developing process with a developing liquid supplied through the chemical liquid nozzle, then rinses the wafer surface with a rinse liquid, and rotates the wafer holding section to dry the wafer surface, and has nearly the same structure as the coating unit in FIG. 4.

In the DEV layers B1, B2, the shelf unit U5 is provided with the first transfer stages (TRS1, TRS2, TRS-F) and the dummy stage (DUM1), and the shelf unit U6 is provided with the second transfer stages (TRS6, TRS7) and the dummy stage (DUM1). In each of the DEV layers B1 and B2, wafers W are transferred among the first transfer stages TRS1, TRS2, TRS-F, the second transfer stages TRS6, TRS7, the dummy stage (DUM1, DUM2), the developing module (DEV), the individual modules of the shelf units U1 to U4 by the associated main transfer mechanism A1, A2 which serves as the substrate transfer mechanism 2.

As the temperature regulating modules (CPL11, CPL21, CPL31, CPL41, CPL51) and the cooling modules (CPL32, CPL42, CPL52), a unit configured to regulate the temperature of a wafer W placed on a temperature regulating plate (cooling plate) whose temperature is regulated to a predetermined temperature is used. As the heating modules (HP3, HP4, HP5), a unit configured to regulate the temperature of a wafer W placed on a heating plate is used.

As the heating modules (PEB1, PEB2, POST1, POST2), a unit which has a heating plate and a cooling plate also serving as a transfer arm, allows a wafer W to be transferred between the main arms A1-A5 and the heating plate, and can thus perform both heating and cooling alone is used. The heating modules (PEB1, PEB2, POST1, POST2) are equivalent to the modules that heat and cool substrates.

The exposure apparatus S4 is connected via the interface block S3 to the shelf unit U6 in the process block S2. The interface block S3 has an interface-block transfer mechanism 53 for effecting transfer of a wafer W between the shelf unit U6 of the process block S2 and the exposure apparatus S4. In this embodiment, the interface-block transfer mechanism 53 is so configured as to be advanceable and retreatable, liftable up and down, and rotatable about the vertical axis to transfer wafers W to and from the second transfer stages TRS6 to TRS9 of the first to fourth unit blocks B1 to B4. The interface-block transfer mechanism 53 may be configured in such a way as to transfer wafers W to and from the second transfer stages TRS6 to TRS10 of all the unit blocks B1 to B5.

Figure 11:
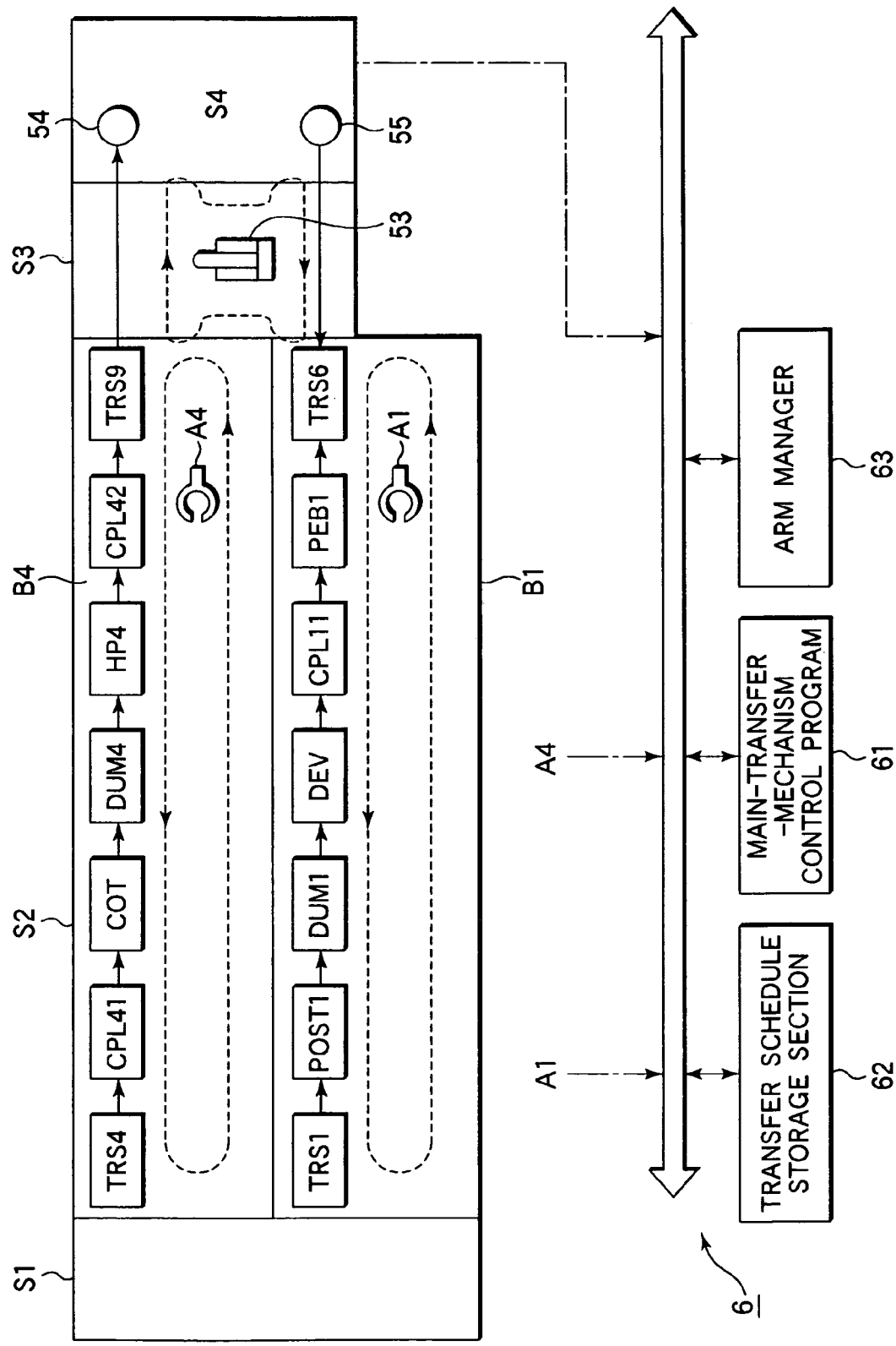
FIG. 11 is an exemplary diagram illustrating the flow of a wafer in the coating and developing apparatus in FIG. 7, a transfer area of each transfer mechanism and a control section.

FIG. 11 is an explanatory diagram illustrating the transfer order for wafers W in the unit block B4 (COT layer) for forming a resist film and the unit block B1 (DEV layer) for performing a developing process both in the process block S2, the interface block S3, and the exposure apparatus S4 in a manner matching the transfer systems for wafers W and the wafer transfer order, and also shows the structure of the control section 6. The transfer path for wafers W in the COT layer B4 is the transfer path where the dehydrphobic process module (ADH) is not used. As shown in FIG. 11, the exposure apparatus S4 has a carry-in stage 54 and a carry-out stage 55.

While the control section 6 controls the general transfer system of the developing apparatus, FIG. 11 shows merely those essential portions of the control section 6 in the embodiment. The control section 6 includes a main-transfer-mechanism control program 61, a transfer schedule storage section 62, and an arm manager 63.

The main-transfer-mechanism control program 61 controls the main transfer mechanisms A1 to A3 of the unit blocks B1 to B3 for formation of a coat film and the main transfer mechanisms A1, A2 of the unit blocks B1, B2 for a developing process by referring to a transfer schedule stored in the transfer schedule storage section 62, and controls the main arms A1 to A5 based on information from the arm manager 63.

The transfer schedule storage section 62 stores the transfer schedule stored that represents the time sequential correlation between each module and wafers W, given that places where wafers W are to be placed are called modules. FIG. 12 illustrates one part of the transfer schedule table (the transfer schedule of the COT layer B4) when a resist liquid is applied to a wafer W using the transfer path where the dehydrphobic process module (ADH) is not used, and phases 1, 2 and so forth indicate the correlation between modules and wafers (A01 to A10) in one transfer cycle, with the layout of the modules being shown in the upper column. Those modules which are laid out horizontally are either modules or the dummy stage (DUM4), and are TRS4 (stage module), CPL41 (temperature regulating module), COT (coating module), DUM4 (dummy stage), HP (heating module), CPL42 (cooling module), and TRS9 (transfer stage). The layout of the modules is in the order of the wafer flow, and corresponds to the layout of the modules in FIG. 8.

For example, phase 1 indicates that the first wafer A01 or the top wafer in the lot is positioned at TRS4. Phase 3 indicates that the wafers A03, A02 and A01 are positioned at TRS4, CPL41, and COT, respectively. The main-transfer-mechanism control program 61 reads the phases of the transfer schedule 62 in order, and transfers wafers in such a way as to bring about the states corresponding to the read phases. As the phases are read in order to transfer wafers, therefore, the wafer transfer is carried out in such a way that the wafers are transferred, one by one, to a module following the previous module by one in the order.

The arm manager 63 has a program that determines which one of the upper arm 21 and the lower arm 22 receives the wafer W on the first stage module (TRS4) at the upstream end in the transfer path so that the lower arm 22 always transfers the wafer W from the temperature regulating module (CPL41) to the coating module (COT).

Next, the operation of the apparatus according to the embodiment of the present invention configured in the above manner will be described with reference to a flowchart illustrated in FIG. 13. The apparatus can form antireflection films on the top and bottom of a resist film, respectively, form an antireflection film only on either the top or the bottom of a resist film, or form a resist film using only a COT layer (unit block B4) and without forming an antireflection film. To make the description as simple as possible, the description will be given of a case where a resist film is formed using only the COT layer (unit block B4) and a developing process is executed using the DEV layer or the unit block B1.

First, an operator selects a transfer recipe to apply a resist liquid to a wafer W having an antireflection film formed thereon, i.e., a transfer recipe to transfer a wafer W through the transfer path where the dehydrphobic process module (ADH) is not used (step S1). The transfer recipe describes modules to be used, the dummy stage (DUM4), and the order of using them (the sequence in which the wafer W is transferred), and is, for example, a transfer recipe which transfers the wafer W in the COT layer B4 according to a transfer schedule shown in FIG. 12. When the transfer recipe is selected, the arm manager 63 determines whether the temperature regulating module (CPL41) becomes an even-numbered module or not when numbers are sequentially assigned to the downstream modules with the stage module (TRS4) taken as the first module (step S2). When it is determined as an even-numbered module, the flow goes to step S3 to output an instruction to the main transfer mechanism A4 so that the upper arm 21 goes and receives the wafer W on the stage module (TRS4). When it becomes an odd-numbered module, the flow goes to step S4 to output an instruction to the main transfer mechanism A4 so that the lower arm 22 goes and receives the wafer W on the stage module (TRS4). In this case, as the temperature regulating module (CPL41) is the second module, an instruction is given so that the upper arm 21 goes and picks up the wafer W on the stage module (TRS4).

Meanwhile, in the apparatus, the carrier 30 is transferred into the carrier block 31 from outside, and the transfer arm C picks up the wafer W from the carrier 30. The wafer W is transferred first to the first transfer stage TRS-F of the shelf unit U5 of the second unit block B2 from the transfer arm C, and is then transferred to the first transfer section TRS4 (stage module) with the first transfer arm 51.

At the next step S5, the determined arm (upper arm 21) of the main transfer mechanism A4 goes and picks up the wafer W on the stage module (TRS4), and thereafter transfers the wafer W and performs application of a resist liquid according to the transfer schedule. That is, as shown in FIG. 6A and FIG. 11, the main transfer mechanism A4 transfers the wafer W in the order of temperature regulating module (CPL41)→coating module (COT)→dummy stage (DUM4)→heating module (HP4)→cooling module (CPL42)→transfer stage TRS 9 of shelf unit U6 to thereby form a chemically amplified resist film. Subsequently, the wafer W on the transfer stage TRS9 is transferred to the transfer stage 54 of the exposure apparatus S4 with the interface arm 53, and an exposure process is carried out by the exposure apparatus S4.

The wafer W after exposure is transferred to the transfer stage 55, and is transferred to the transfer stage TRS6 of the DEV layer B1 with the interface arm 53. The wafer W on the stage TRS6 is received by the main transfer mechanism A1 of the DEV layer B1, and is transferred in the order of heating module (PEB1)→temperature regulating module (CPL11)→developing module (DEV)→heating module (POST1)→first transfer stage TRS1, and a predetermined developing process is performed. The wafer W undergone the developing process this way is returned to the original carrier 30 placed in the carrier block S1 from the first transfer stage TRS1 with the carrier-block transfer mechanism C. With regard to wafer transfer in the process block S2, wafers are sequentially transferred in the DEV layer according to the transfer schedule in a similar manner, so that the wafers are transferred one by one to following modules.

Figure 13:
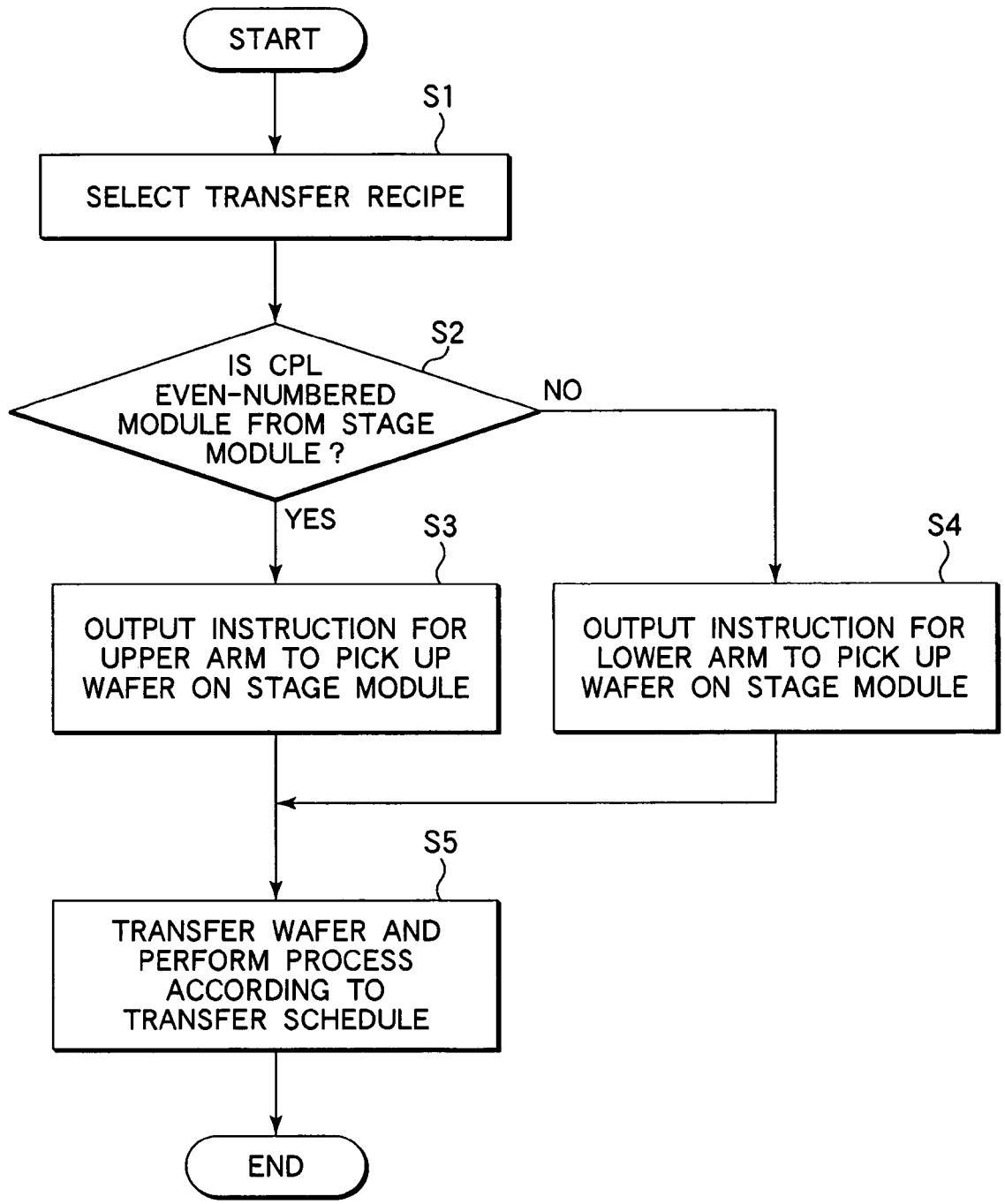
FIG. 13 is a flowchart illustrating a transfer flow of a wafer in a unit block for formation of a coating film.
Figures 14, 15:
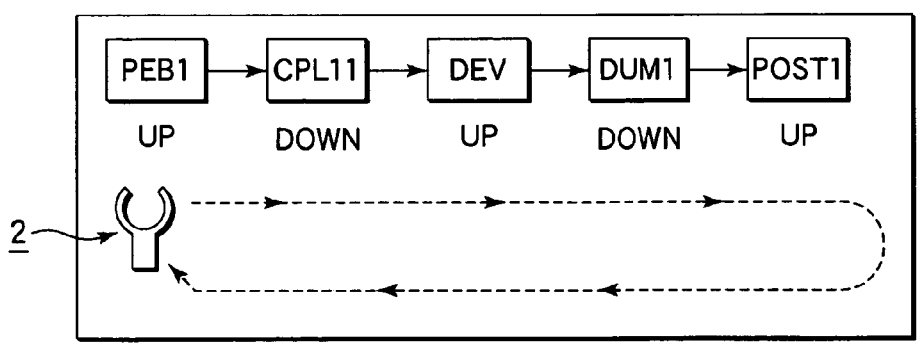
FIG. 14 is an explanatory diagram illustrating one example of a wafer transfer schedule in a unit block for formation of a coating film.
FIG. 15 is an explanatory diagram illustrating the layout of other modules to be used in the first embodiment of the invention.

When the operator selects a transfer recipe to apply a resist liquid to a wafer W having no antireflection film formed thereon as in the case of changing the lot or the like, i.e., a transfer recipe to transfer a wafer W through the transfer path where the dehydrphobic process module (ADH) is used, the transfer schedule at this time is illustrated in FIG. 14, and the temperature regulating module (CPL41) becomes the third module when numbers are sequentially assigned to the downstream modules with the stage module (TRS4) taken as the first module according to the flowchart shown in FIG. 13. Accordingly, an instruction is given to the main transfer mechanism A4 so that the lower arm 22 goes and receives the wafer W on the stage module (TRS4).

Then, the lower arm 22 goes and receives the wafer W on the stage module (TRS4), and thereafter transfers the wafer W, and application of a resist liquid is carried out according to the transfer schedule. That is, as shown in FIG. 6B, the main transfer mechanism A4 transfers the wafer W in the order of dehydrphobic process module (ADH)→temperature regulating module (CPL41)→coating module (COT)→dummy stage (DUM4)→heating module (HP4)→cooling module (CPL41)→transfer stage TRS 9 of shelf unit U6 to thereby form a chemically amplified resist film.

A sequence of coating processes to be executed in this manner is carried out according to a computer program which is stored in the control section 6 and contains steps incorporate therein to execute those processes.

According to the embodiment, the arm manager 63 determines with which one of the upper arm 21 and the lower arm 22 the wafer W on the first stage module (TRS4) at the upstream end in the transfer path, and the dummy stage (DUM4) is arranged between the coating module (COT) and the heating module (HP), so that even when because of different transfer recipes, the transfer path for a wafer W differs between a case where the dehydrphobic process module (ADH) is used and a case where it is not used, the lower arm 22 always transfers the wafer W from the temperature regulating module (CPL) to the coating module (COT), and the upper arm 21 always receives the wafer W from the heating module (HP).

Therefore, the wafer W is not transferred to the coating module (COT) from the temperature regulating module (CPL41) by using the upper arm 21 that has been heated at the time of receiving the wafer W from the heating module (HP4). Accordingly, the wafer W whose temperature has been regulated with high accuracy in the temperature regulating module (CPL41) is transferred to the coating module (COT) from the temperature regulating module (CPL41) with the lower arm 22 that is not heated and whose temperature does not change much, making it possible to execute the transfer with the suppressed thermal influence of the arm.

This can suppress a change in substrate in-plane temperature of a wafer W at the time of the wafer transfer, such as deterioration of the in-plane uniformity of the wafer temperature originating from a difference in wafer temperature caused by heat transfer from the arm at a location where the arm holding the wafer W is in contact and a location where it is not in contact. Accordingly, the coating module (COT) can perform application of a resist liquid with high uniformity of the in-plane temperature of the wafer W at the proper wafer temperature, so that an adequate coating process with high in-plane uniformity of a film thickness or the like can be carried out.

When reception of a wafer W from the heating module (HP) is done with the upper arm 21, the heat is likely to propagate upward, so that the thermal influence on the other arm can be made smaller as compared with a case where reception of the wafer W from the heating module (HP4) is done with the lower arm 22.

In this example, switching of the transfer path between the transfer path where the dehydrphobic process module (ADH) is used and the transfer path where the dehydrphobic process module (ADH) is not used according to the wafer W is carried out, as has already been mentioned, by selecting either the transfer recipe to transfer a wafer W along the transfer path where the dehydrphobic process module (ADH) is used or the transfer recipe to transfer a wafer W along the transfer path where the dehydrphobic process module (ADH) is not used.

According to the embodiment, the coating module may be a developing module (DEV) which applies a developing liquid as a coating liquid to a wafer W. In this case, the stage module located at the upstream end in the transfer path can be a module on which an exposed and heated substrate is placed, e.g., a module located upstream of the temperature regulating module (CPL11) in the transfer path for wafers W in the DEV layer B1 (B2), such as the second transfer stages TRS6 (TRS7) or the heating module (PEB).

This case will be explained with reference to the module of the DEV layer B1 referring to FIG. 15. When the heating module (PEB1) is a stage module located at the upstream end in the transfer path, for example, a wafer W is transferred in the order of heating module (PEB1)→temperature regulating module (CPL11)→developing module (DEV)→dummy stage (DUM1)→heating module (POST1). In this case, if numbers are sequentially assigned to the downstream modules with the heating module (PEB1) taken as the first module, the temperature regulating module (CPL11) becomes an even-numbered (second) module, so that the main transfer mechanism A1 (A2) is controlled in such a way that the upper arm 21 receives the wafer W on the first heating module (PEB1). As the dummy stage (DUM1) is located between the developing module (DEV) and the heating module (HP) in the transfer path, the arm (lower arm 22) that transfers the wafer W from the temperature regulating module (CPL11) to the developing module (DEV) differs from the arm (upper arm 21) that receives the wafer W from the heating module (POST1).

Even in this case, therefore, as a wafer W is transferred to the developing module (DEV) from the temperature regulating module (CPL11) using the arm that has not been heated, thereby suppressing a change in temperature of the wafer W at the time of the wafer transfer. This makes it possible to perform a developing process on the wafer W with high in-plane temperature uniformity maintained, thereby improving the in-plane uniformity of the developing process. In this example where the heating module (POST1) designed to have both a heating plate and a cooling plate is used, the combination of a heating module (HP) having only a heating plate and a cooling module (CPL) having only a cooling plate may however be used in place of the heating module (POST1).

The method of the embodiment can be adapted to the TCT layer B3 or the BCT layer B5. In the TCT layer B3, for example, the coating module is an antireflection film module (BARC2), and the stage module located at the upstream end in the transfer path is the transfer unit TRS3 (or TRS8, and the wafer W is transferred in the order of transfer unit TRS3 (or TRS8)→temperature regulating module (CPL31)→antireflection film module (BARC2)→dummy stage (DUM3)→heating module (HP3)→cooling module (CPL32)→transfer unit TRS8 (or TRS3).

In this case, when the stage module (TRS3 or TRS8) is the first module, the temperature regulating module (CPL) becomes an even-numbered (second) module, so that the main transfer mechanism A3 is controlled in such a way that the upper arm 21 receives the wafer W on the stage module (TRS3 or TRS8). As the dummy stage (DUM3) is located between the antireflection film module (BARC2) and the heating module (HP) in the transfer path, the arm (lower arm 22) that transfers the wafer W from the temperature regulating module (CPL31) to the antireflection film module (BARC2) differs from the arm (upper arm 21) that receives the wafer W from the heating module (HP3). In the BCT layer B5, a wafer W is transferred in the same way as done in the TCT layer B3, except for an antireflection film module (BARC1) being involved instead of the antireflection film module (BARC2).

Even in those cases, therefore, a change in the temperature of the wafer W when the wafer W is transferred to the antireflection film module (BARC1, BARC2) from the temperature regulating module (CPL31, CPL51) is suppressed, the antireflection film can be formed on the wafer W with high in-plane temperature uniformity maintained, thereby improving the in-plane uniformity of the process.

A second embodiment of the invention will be described next.

Figure 16:
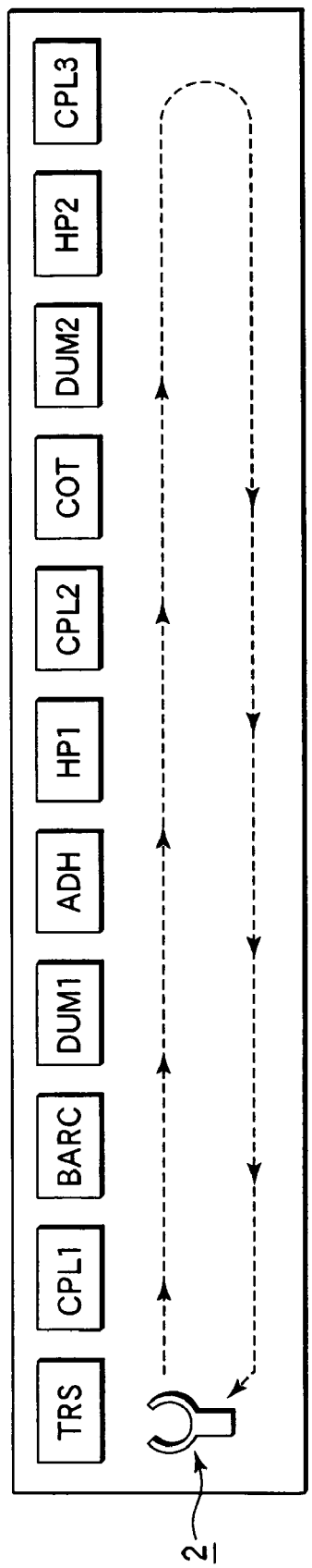
FIG. 16 is an explanatory diagram illustrating the layout of modules to be used in a second embodiment of the invention.

In the embodiment, as a coating apparatus is used an apparatus, as shown in, for example, FIG. 16, in which a stage module (TRS), a first temperature regulating module (CPL) which regulates the temperature of a wafer W to a set temperature, an antireflection film module (BARC) which serves as a first coating module to apply a first coating liquid or a chemical liquid for an antireflection film to the temperature-regulated wafer W, a first dummy stage (DUM1), a dehydrphobic process module (ADH) which performs a dehydrphobic process to the top surface of the wafer W while heating the wafer W prior to application of the coating liquid, a first heating module (HP1), a second temperature regulating module (CPL2) which cools down the wafer W to a set temperature, a coating module (COT) which serves as a second coating module to apply a second coating liquid to the temperature-regulated wafer W, a second heating module (HP2) which heats the wafer W applied with the second coating liquid, and a cooling module (CPL3) which cools the wafer W are laid out in the same process block, the wafer W is transferred to each module using a common substrate transfer mechanism 2.

Figure 17A:
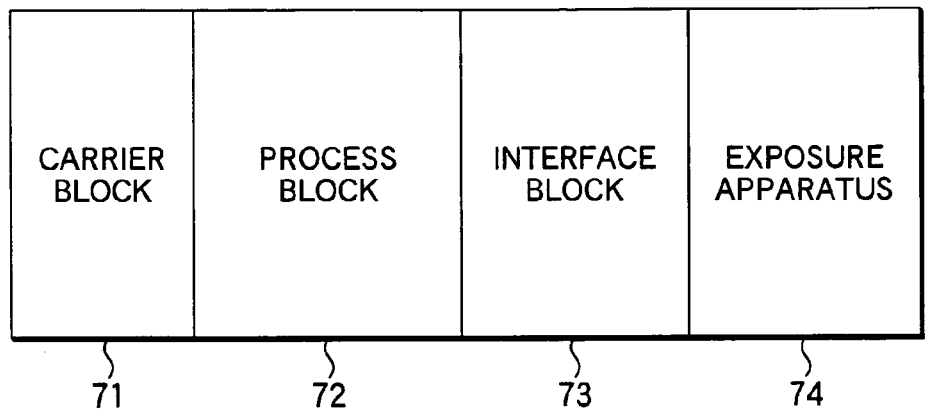
FIGS. 17A and 17B are plan views exemplarily showing a coating and developing apparatus to be adapted to the second embodiment of the invention.
Figure 17B:
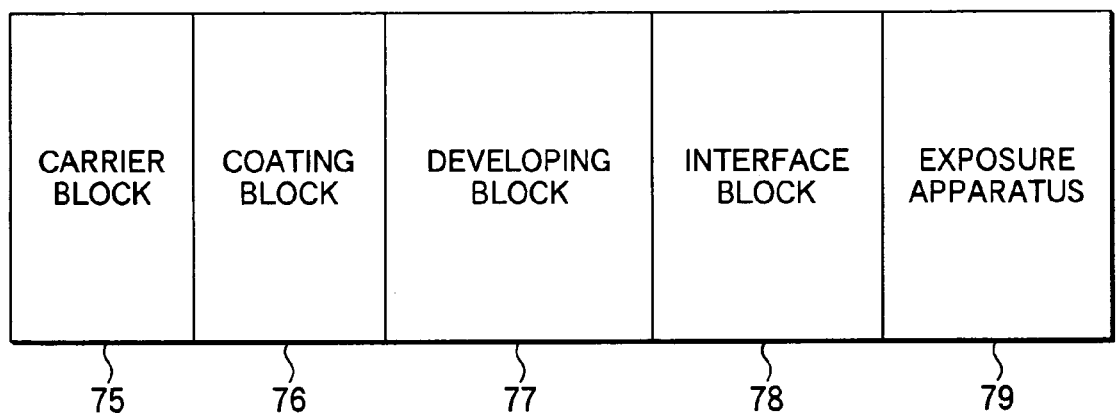

Apparatuses as shown in FIGS. 17A and 17B are employed as such an apparatus. In the apparatus shown in FIG. 17A, a carrier block 71 where a carrier retaining multiple wafers W is carried in and out, a process block 72 which performs formation of an antireflection film, application of a resist liquid, a developing process, etc., an interface block 73, and an exposure apparatus 74 are laid out side by side and in parallel to one another horizontally in the mentioned order. In the process block 72, modules or the like shown in FIG. 16, modules for performing the developing process (a transfer module serving as a stage module, a heating module (PEB), a developing module (DEV), a temperature regulating module (CPL), a heating module (POST), a dummy stage (DUM), etc.) and the substrate transfer mechanism 2 for transferring the wafer W to those modules are laid out. The apparatus is configured in such a way that after the process block 72 forms an antireflection film on the wafer W transferred from the carrier block 71 and applies the resist liquid to the wafer W, the exposure apparatus 74 performs an exposure process to the wafer W via the interface block 73, and then the process block 72 performs a developing process again on the wafer W which is then returned to the carrier block 71.

The apparatus shown in FIG. 17B is configured in such a way that a carrier block 75, a coating block 76 which performs application of a resist liquid, a developing block 77 which performs a developing process, an interface block 78, and an exposure apparatus 79 are laid out side by side and in parallel to one another horizontally in the mentioned order. The coating block 76 is provided with modules shown in, for example, FIG. 16, and the substrate transfer mechanism 2, and performs formation of an antireflection film and application of a resist liquid. In the developing block 77, modules for performing the developing process (a transfer module serving as a stage module, a heating module (PEB), a developing module (DEV), a temperature regulating module (CPL), a heating module (POST), a dummy stage (DUM), etc.) and a substrate transfer mechanism which transfers the wafer W to those modules are laid out, so that a developing process is performed on an exposed wafer W.

In the apparatus, after the coating block 76 forms an antireflection film on the wafer W transferred from the carrier block 75 and applies the resist liquid to the wafer W, the exposure apparatus 79 performs an exposure process to the wafer W via the interface block 78, and then the developing block performs a developing process on the wafer W which is then returned to the carrier block 75.

Figure 18A:
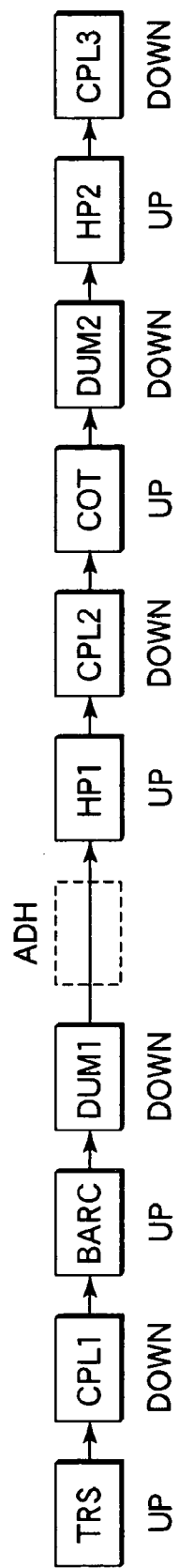
FIGS. 18A and 18B are diagrams illustrating the layout of modules and arms to be used in a substrate transfer mechanism in the coating and developing apparatus that is adapted to the second embodiment of the invention.

In such an apparatus, in a process which forms an antireflection film onto a wafer W and does not use a dehydrphobic process module (ADH) as shown in FIG. 18A, for example, the wafer W is transferred in the transfer path of the stage module (TRS) located at the upstream end→first temperature regulating module (CPL1)→antireflection film module (BARC)→first dummy stage (DUM1)→first heating module (HP1)→second temperature regulating module (CPL2)→coating module (COT)→second dummy stage (DUM2)→second heating module (HP2)→cooling module (CPL3).

If numbers are sequentially assigned to the downstream modules with the stage module (TRS) at the upstream end taken as the first module, the first temperature regulating module (CPL11) and the second temperature regulating module (CPL2) respectively become a second module and a sixth module, so that the lower arm 22 goes to receive the wafer W on the first stage module (TRS). In FIG. 18A, the words "UP" and "DOWN" described below each module indicate whether the arm that goes to receive a wafer W in the module is the upper arm 21 or the lower arm 22.

As the first dummy stage (DUM1) and the second dummy stage (DUM2) are located between the antireflection film module (BARC) or the first coating module, and the first heating module (HP1), and between the coating module (COT) or the second coating module, and the second heating module (HP2), respectively, it is the lower arm 22 that receives the wafer W from the first and second heating modules (HP1, HP2), and the arm that transfers the wafer W from the first temperature regulating module (CPL1) to the antireflection film module (BARC) and the arm that transfers the wafer W from the second temperature regulating module (CPL2) to the coating module (COT) differ from the arm that receives the wafer W from the first and second heating modules (HP1, HP2).

Figure 18B:
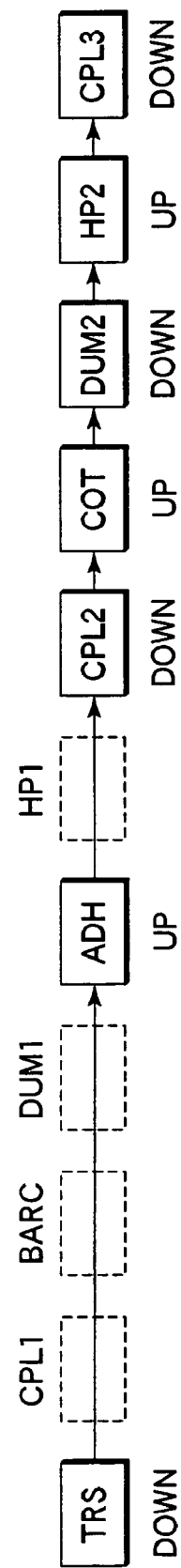

In a process which does not form an antireflection film onto a wafer W and uses a dehydrphobic process module (ADH) as shown in FIG. 18B, for example, the wafer W is transferred in the transfer path of the stage module (TRS) located at the upstream end→dehydrphobic process module (ADH)→second temperature regulating module (CPL2)→coating module (COT)→second dummy stage (DUM2)→second heating module (HP2)→cooling module (CPL3).

If, in this case, numbers are sequentially assigned to the downstream modules with the stage module (TRS) at the upstream end taken as the first module, the second temperature regulating module (CPL2) becomes a third module, so that the lower arm 22 goes to receive the wafer W on the first stage module (TRS).

As the second dummy stage (DUM2) is located between the coating module (COT) and the second heating module (HP2), it is the lower arm 22 that receives the wafer W from the second heating module (HP2), and the arm that transfers the wafer W from the second temperature regulating module (CPL2) to the coating module (COT) differs from the arm that receives the wafer W from the second heating module (HP2).

Those apparatuses require that the module transfer path be prepared in such a way that when numbers are sequentially assigned to the downstream modules with the stage module (TRS) taken as the first module, the first temperature regulating module (CPL1) and the second temperature regulating module (CPL2) both become odd-numbered modules or both become even-numbered modules.

A recipe for transferring a wafer W in a transfer path where an antireflection film is formed on a wafer W and a dehydrphobic process module (ADH) is not used, and a recipe for transferring a wafer W in a transfer path where no antireflection film is formed on a wafer W and a dehydrphobic process module (ADH) is used are prepared, and the substrate transfer mechanism 2 is control in such a way that the transfer path is switched between a transfer path involving the first temperature regulating module (CPL1), the antireflection film module (BARC), the first dummy stage (DUM1), and the first heating module (HP1), and a transfer path involving a dehydrphobic process module (ADH) is used in place of those modules of the former transfer path by selecting an adequate transfer recipe according to the wafer W. Even in those apparatuses, the same scheme as has been explained referring to FIG. 15 is adapted in a developing process.

The invention is not limited to the embodiments discussed above, but can be modified in various forms within the spirit and scope of the invention. For instance, a transfer module which is used as a stage module located at the upstream end in the transfer path is employed merely for wafer transfer, this module may have the capability of a cooling plate in addition to the wafer transfer capability. The stage module may be a heating module having a wafer heating plate and a wafer cooling plate.

Although the heating module (HP) having a heating plate and the temperature regulating module (CPL) having a cooling plate are laid out downstream of the coating module (COT) in order in the embodiments, a heating module having a wafer heating plate and a wafer cooling plate may be provided in place of the heating module (HP) and the temperature regulating module (CPL).

It is described in the foregoing description of the embodiments that a temperature regulating mechanism is provided as a temperature regulating module, which is not however limited to this particular type, but may be a simple plate for regulating the temperature to, for example, room temperature.

What is claimed is:

1. A coating method which uses a coating apparatus comprising a coating section having a stage module, a temperature regulating module which adjusts a temperature of a substrate to a set temperature, a coating module which applies a coating liquid to the temperature-regulated substrate, and a heating module which heats the coating-liquid applied substrate, arranged in order from an upstream end of transfer along a transfer path of the substrate; and a substrate transfer mechanism which has an upper arm and a lower arm, provided one on the other and advanceable and retreatable independently of each other, and operates to transfer the substrate downstream from an upstream side along the transfer path of the substrate, the coating method comprising:
receiving a substrate on the stage module with one of the upper arm and the lower arm;
receiving a substrate placed on a next module with the other one of the upper arm and the lower arm;
further transferring the substrate on the one of the arms to said next module; and
alternately operating the upper arm and the lower arm in this manner to transfer substrates from an upstream module to a downstream module one by one,
wherein a dummy stage is placed between the coating module and the heating module so as to make that arm which performs transfer from the temperature regulating module to the coating module differ from that arm which receives a substrate from the heating module, and
numbers are sequentially assigned to downstream modules with the stage module at the upstream end taken as a first module, that substrate which is located on the first stage module is received with the upper arm when the temperature regulating module is an even-numbered module, and the substrate located on the first stage module is received with the lower arm when the temperature regulating module is an odd-numbered module, so that substrate transfer from the temperature regulating module to the coating module is always carried out with the lower arm.

2. The coating method according to claim 1, wherein a dehydrophobic process module which performs a dehydrophobic process on a surface of the substrate while heating the substrate prior to application of the coating liquid to the substrate is laid out along the transfer path, and a process is carried out switching a transfer path where the dehydrophobic process module is used and a transfer path where the dehydrophobic process module is not used from one to the other according to the substrate.

3. The coating method according to claim 1, wherein the stage module located at the upstream end of the transfer path is a transfer module for receiving and transferring substrates.

4. The coating method according to claim 3, wherein the transfer module also serves as a cooling plate.

5. The coating method according to claim 1, wherein the coating module serves to apply a resist liquid or a chemical liquid for an antireflection film to a substrate.

6. The coating method according to claim 1, wherein the coating module serves to apply a developing liquid to a substrate, and the stage module located at the upstream end of the transfer path is where a substrate exposed and heated is to be placed.

7. The coating method according to claim 1, wherein the coating module serves to apply a developing liquid to a substrate, the stage module located at the upstream end of the transfer path is where a substrate exposed is to be placed, and a module for heating and cooling a substrate is laid out between the stage module and the temperature regulating module in the transfer path.

8. The coating method according to claim 1, further comprising:
   recognizing a substrate transfer path;
   sequentially assigning numbers to downstream modules with the stage module at the upstream end taken as a first module; and
   recognizing whether the temperature regulating module is an even-numbered module or an odd-numbered module.

9. A coating method which uses a coating apparatus comprising a coating section having a stage module, a first temperature regulating module which adjusts a temperature of a substrate to a set temperature, a first coating module which applies a first coating liquid to the temperature-regulated substrate, a first heating module which heats the substrate applied with the first coating liquid, a second temperature regulating module which cools down the substrate to adjusts a temperature thereof to the set temperature, a second coating module which applies a second coating liquid to the temperature-regulated substrate, and a second heating module which heats the substrate applied with the second coating liquid, arranged in order from an upstream end of transfer along a transfer path of the substrate; and a substrate transfer mechanism which has an upper arm and a lower arm, provided one on the other and advanceable and retreatable independently of each other, and operates to transfer the substrate downstream from an upstream side along the transfer path of the substrate, the coating method comprising:
   receiving a substrate on the stage module with one of the upper arm and the lower arm;
   receiving a substrate placed on a next module with the other one of the upper arm and the lower arm;
   further transferring the substrate on the one of the arms to said next module; and
   alternately operating the upper arm and the lower arm in this manner to transfer substrates from an upstream module to a downstream module one by one,
   wherein a first dummy stage is placed between the first coating module and the first heating module so as to make that arm which performs transfer from the first temperature regulating module to the first coating module differ from that arm which receives a substrate from the first heating module,
   a second dummy stage is placed between the second coating module and the second heating module so as to make that arm which performs transfer from the second temperature regulating module to the second coating module differ from that arm which receives a substrate from the second heating module, and
   numbers are sequentially assigned to downstream modules with the stage module at the upstream end taken as a first module, that substrate which is located on the first stage module is received with the upper arm when the first temperature regulating module and the second temperature regulating module are even-numbered modules, and the substrate located on the first stage module is received with the lower arm when the first temperature regulating module and the second temperature regulating module are odd-numbered modules, so that substrate transfer from the temperature regulating module to the coating module is always carried out with the lower arm.

10. The coating method according to claim 9, wherein the first coating module serves to apply a chemical liquid for an antireflection film to a substrate, and the second coating module serves to apply a resist liquid to a substrate.

11. The coating method according to claim 9, wherein a dehydrophobic process module which performs a dehydrophobic process on a top surface of the substrate while heating the substrate prior to application of the coating liquid to the substrate is laid upstream of the first temperature regulating module in the transfer path, and a process is carried out switching a transfer path where the first temperature regulating module, the first coating module, the first dummy stage and the first heating module are used and a transfer path where the dehydrophobic process module is used in place of those modules from one to the other according to the substrate.

12. The coating method according to claim 9, wherein the stage module located at the upstream end of the transfer path is a transfer module for receiving and transferring substrates.

13. The coating method according to claim 12, wherein the transfer module also serves as a cooling plate.

14. The coating method according to claim 9, further comprising:
   recognizing a substrate transfer path;
   sequentially assigning numbers to downstream modules with the stage module at the upstream end taken as a first module; and
   recognizing whether the temperature regulating modules are even-numbered modules or odd-numbered modules.

* * * * *